US011177266B2

(12) United States Patent
Tang et al.

(10) Patent No.: US 11,177,266 B2
(45) Date of Patent: Nov. 16, 2021

(54) ARRAY OF CAPACITORS, AN ARRAY OF MEMORY CELLS, A METHOD OF FORMING AN ARRAY OF CAPACITORS, AND A METHOD OF FORMING AN ARRAY OF MEMORY CELLS

(71) Applicant: Micron Technology, Inc., Boise, ID (US)

(72) Inventors: Sanh D. Tang, Meridian, ID (US); Kirk D. Prall, Boise, ID (US); Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/550,917

(22) Filed: Aug. 26, 2019

(65) Prior Publication Data

US 2021/0066306 A1 Mar. 4, 2021

(51) Int. Cl.
*H01L 27/108* (2006.01)

(52) U.S. Cl.
CPC .. *H01L 27/10864* (2013.01); *H01L 27/10829* (2013.01)

(58) Field of Classification Search
CPC ......... H01L 27/10864; H01L 27/10829; H01L 29/66666; H01L 27/10858; H01L 27/1082; H01L 28/90
See application file for complete search history.

(56) References Cited

U.S. PATENT DOCUMENTS 6,278,149 B1 * 8/2001 Sato .................. H01L 27/10894 257/296
9,305,929 B1 4/2016 Karda et al.
10,163,917 B2 12/2018 Ramaswamy
(Continued)

FOREIGN PATENT DOCUMENTS

KR 10-2018-011652 10/2018
WO WO PCT/US2020/045842 12/2020

OTHER PUBLICATIONS

U.S. Appl. No. 16/255,569, filed Jan. 23, 2019, by Calderoni et al.
(Continued)

*Primary Examiner* — Edward Chin
(74) *Attorney, Agent, or Firm* — Wells St. John P.S.

(57) ABSTRACT

A method of forming an array of capacitors comprises forming a vertical stack above a substrate. The stack comprises a horizontally-elongated conductive structure and an insulator material directly above the conductive structure. Horizontally-spaced openings are formed in the insulator material to the conductive structure. An upwardly-open container-shaped bottom capacitor electrode is formed in individual of the openings. The bottom capacitor electrode is directly against conductive material of the conductive structure. The conductive structure directly electrically couples the bottom capacitor electrodes together. A capacitor insulator is formed in the openings laterally-inward of the bottom capacitor electrodes. A top capacitor electrode is formed in individual of the openings laterally-inward of the
(Continued)

capacitor insulator. The top capacitor electrodes are not directly electrically coupled together. Structure independent of method is disclosed.

24 Claims, 23 Drawing Sheets

(56) References Cited

U.S. PATENT DOCUMENTS

| | | | |
|---|---|---|---|
| 2012/0193697 A1 | 8/2012 | Takemura | |
| 2013/0001666 A1 | 1/2013 | Heineck et al. | |
| 2013/0330891 A1 | 12/2013 | Chang et al. | |
| 2017/0358609 A1 | 12/2017 | Yamazaki et al. | |
| 2019/0139960 A1 | 5/2019 | Sills et al. | |
| 2019/0189357 A1 | 6/2019 | Chavan et al. | |
| 2019/0296028 A1* | 9/2019 | Sukekawa | H01L 27/11509 |
| 2020/0020695 A1* | 1/2020 | Leobandung | H01L 27/10823 |
| 2020/0235111 A1* | 7/2020 | Calderoni | H01L 28/60 |

OTHER PUBLICATIONS

U.S. Appl. No. 16/354,450, filed Mar. 15, 2019, by Tang et al.
U.S. Appl. No. 16/507,826, filed Jul. 10, 2019, by Mutch et al.
Chen et al., "Chemistry for Positive Pattern Transfer Using Area-Selective Atomic Layer Deposition", Advanced Materials, 2016, United States, pp. 1086-1090.
Kim, et al., "Atomic Layer Deposition of Ni Thin Films and Application to Area-Selective Deposition", Journal of The Electromechanical Society 158, 2011, United States, pp. D1-D5.
Lee et al., "Area-Selective Atomic Layer Deposition of Lead Sulfide: Nanoscale Patterning and DFT Simulations", Langmuir, 2010, United States, pp. 6845-6852.
Lee et al., "High Quality Area-Selective Atomic Layer Deposition Co Using Ammonia Gas as a Reactant", Journal of The Electromechanical Society 157, 2010, United States, pp. D10-D15.
Mackus et al., "The use of atomic layer deposition in advanced nanopatterning", Nanoscale, 2014, United Kingdom, pp. 10941-10960.
Mameli et al., "Area-Selective Atomic Layer Deposition of Si02 Using Acetylacetone as a Chemoselective Inhibitor in an ABC-Type Cycle", ACS Nano, 2017, United States, pp. 9303-9311.
Park et al., "Microcontact patterning of ruthenium gate electrodes by selective area atomic layer deposition", Applied Physics Letters 86, 2005, United States, pp. 051903-1-051903-3.
U.S. Appl. No. 17/107,242, filed Nov. 30, 2020, by Mariani et al.
U.S. Appl. No. 17/106,832, filed Nov. 30, 2020, by Rigano.

* cited by examiner

ARRAY OF CAPACITORS, AN ARRAY OF MEMORY CELLS, A METHOD OF FORMING AN ARRAY OF CAPACITORS, AND A METHOD OF FORMING AN ARRAY OF MEMORY CELLS

TECHNICAL FIELD

Embodiments disclosed herein pertain to arrays of capacitors, to arrays of memory cells, to methods of forming an array of capacitors, and to methods of forming an array of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a “0” or a “1. In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. The gate insulator may be capable of being programmed between at least two retentive capacitive states whereby the transistor is non-volatile. Alternately, the gate insulator may not be so capable whereby the transistor is volatile. Regardless, field effect transistors may also include additional structure, for example a reversibly programmable charge-storage region as part of the gate construction between the gate insulator and the conductive gate.

A capacitor is another type of electronic component that may be used in a memory cell. A capacitor has two electrical conductors separated by electrically insulating material. Energy as a charge may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly in such instances, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

Capacitors and transistors may of course be used in integrated circuitry other than memory circuitry and fabricated into arrays that may or may not be at least part of a memory array.

DETAILED DESCRIPTION OF EXAMPLE EMBODIMENTS

Embodiments of the invention include methods used in forming an array of capacitors, for example as may be used in memory or other integrated circuitry. Embodiments of the invention also encompass methods used in forming integrated circuitry comprising an array of memory cells, for example comprising a plurality of vertical transistors that are above a plurality of capacitors. Embodiments of the invention also encompass an array of capacitors that may or may not be part of memory circuitry independent of method of manufacture. Embodiments of the invention also encompass an array of memory cells independent of method of manufacture. Example embodiments of methods of forming an array of memory cells are first described with reference to FIGS. 1-27.

Figure 1:
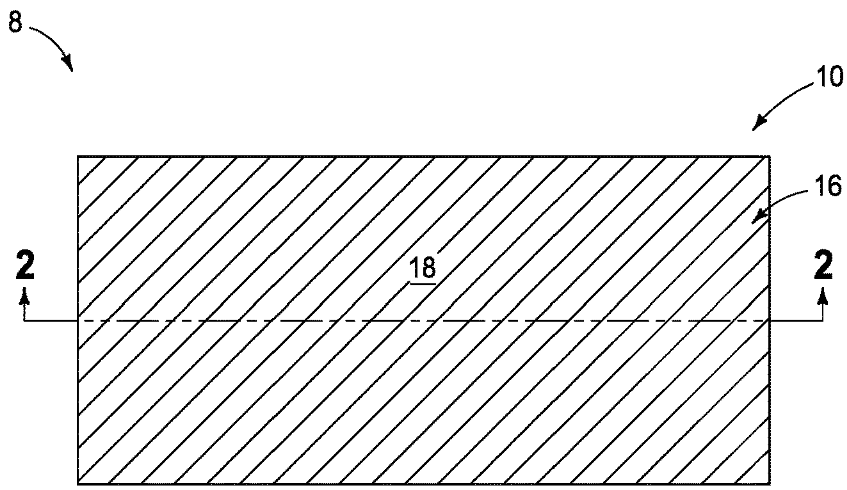
FIG. 1 is a diagrammatic cross-sectional view of a portion of a substrate in process in accordance with an embodiment of the invention and is taken through line 1-1 in FIG. 2.
Figure 2:
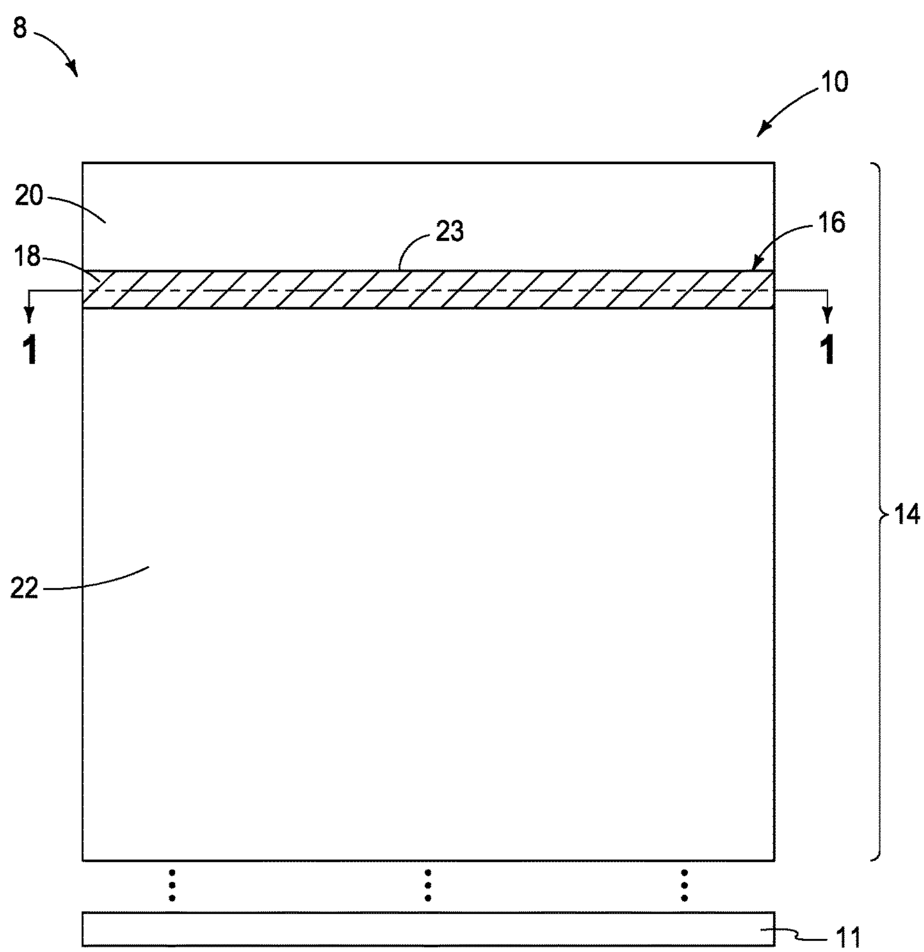
FIG. 2 is a diagrammatic cross-sectional view taken through line 2-2 in FIG. 1.

Referring to FIGS. 1 and 2, such show an example substrate construction 8 comprising an array or array area 10 that has been fabricated relative to a base substrate 11. Substrate 11 may comprise any of conductive/conductor/conducting, semiconductive/semiconductor/semiconducting, and insulative/insulator/insulating (i.e., electrically herein) materials. Various materials are above base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

A vertical stack 14 has been formed above substrate 11. Stack 14 comprises a horizontally-elongated conductive structure 16 (e.g., structure 16 being wider and/or longer in at least one horizontal direction than it is tall) and an insulator material 20 directly above conductive structure 16. In one embodiment, conductive material 18 of conductive structure 16 has intrinsic electrical resistance of 0.001 to 1.0 ohm·cm (i.e., electrical resistance of such value(s) that is an intrinsic property of the composition of material 18 as opposed to resistance there-through in any direction the result of thickness/thinness of such material in such direction(s)). Example conductive material 18 comprises one or more of conductively-doped semiconductive material(s) and metal material(s). Example insulator materials 20 are at least one of silicon dioxide and silicon nitride. Conductive material 18 may be considered as having a top surface 23 which in one embodiment is horizontally-planar. In one embodiment and as shown, stack 14 includes insulating material 22 that is below conductive structure 16 and which may be of the same or different composition(s) as insulator material 20. FIGS. 1 and 2 show an example where conductive structure 16 comprises a plate that extends globally horizontally (e.g., a blanket layer) within array area 10 in which capacitors to-be-formed will be received. Example alternate shape and/or positioned conductive structures 16 are described below.

Figure 3:
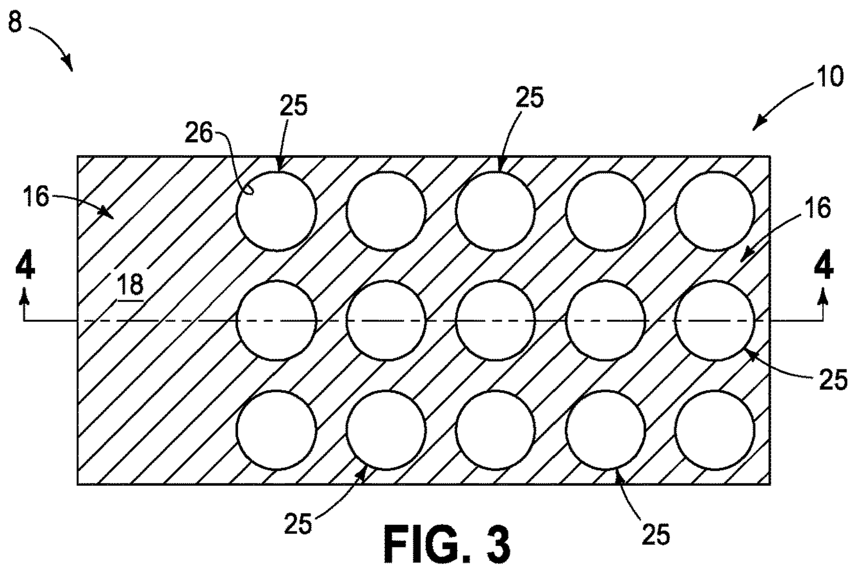
FIGS. 3-27 are diagrammatic sequential sectional and/or enlarged views of the construction of FIGS. 1 and 2, or portions thereof, in process in accordance with some embodiments of the invention.
Figure 4:
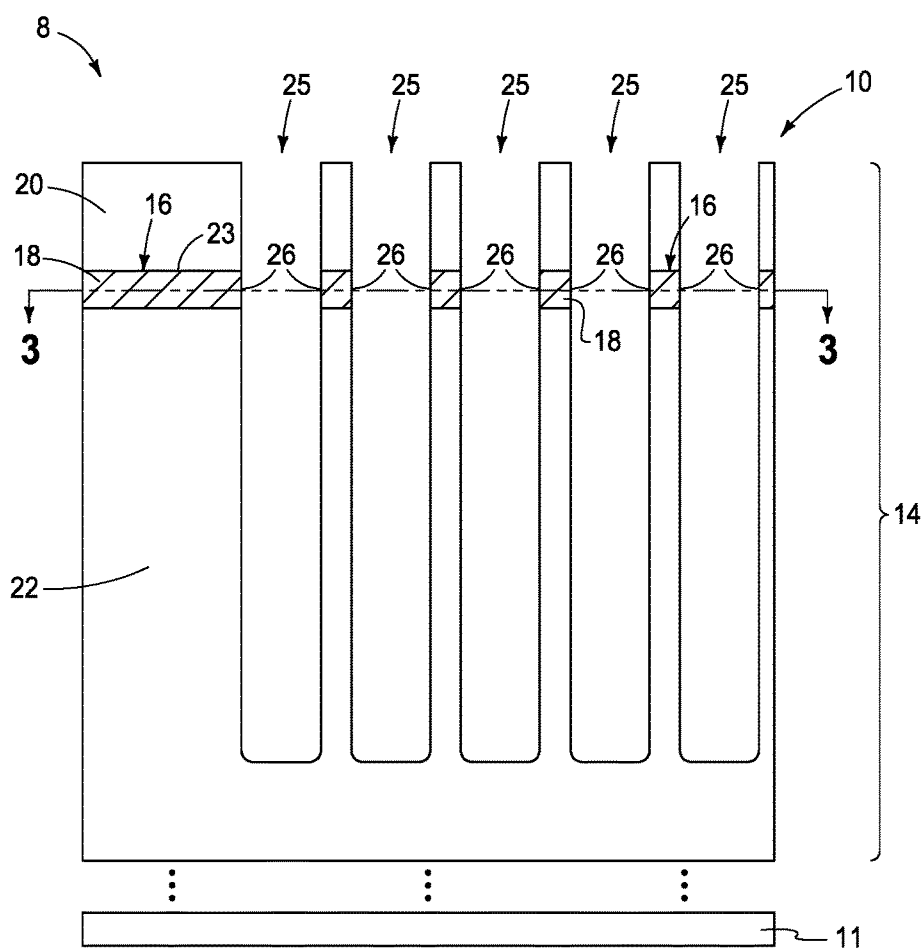

Referring to FIGS. 3 and 4, horizontally-spaced openings 25 have been formed in insulator material 20 to conductive structure 16. In one embodiment and as shown, openings 25 have been formed to extend vertically through conductive material 18 of conductive structure 16, in one embodiment to extend into insulating material 22 there-below, and in one such embodiment whereby openings 25 are formed to be taller below conductive structure 16 than there-above. Openings 25 may be formed by any existing or future-developed technique and with or without using pitch multiplication. An example includes photolithographic patterning and etch using one or more different chemistries. In such, etching of openings 25 below conductive structure 16 may be conducted based on time or to an etch-stop material (not shown). Openings 25 may be arrayed in any existing or future-developed arrangement (e.g., in a Bravais or non-Bravais lattice). Example openings 25 are shown as being circular in horizontal cross-section and having vertical sidewalls, although other shapes and configurations may be used. For purposes of the continuing discussion and in some embodiments, conductive material 18 of conductive structure 16 may be considered as comprising lateral side surfaces 26 (e.g., in the FIGS. 3 and 4 cross-sections and which may also be radial side surfaces where openings 25 are circular).

Figure 5:
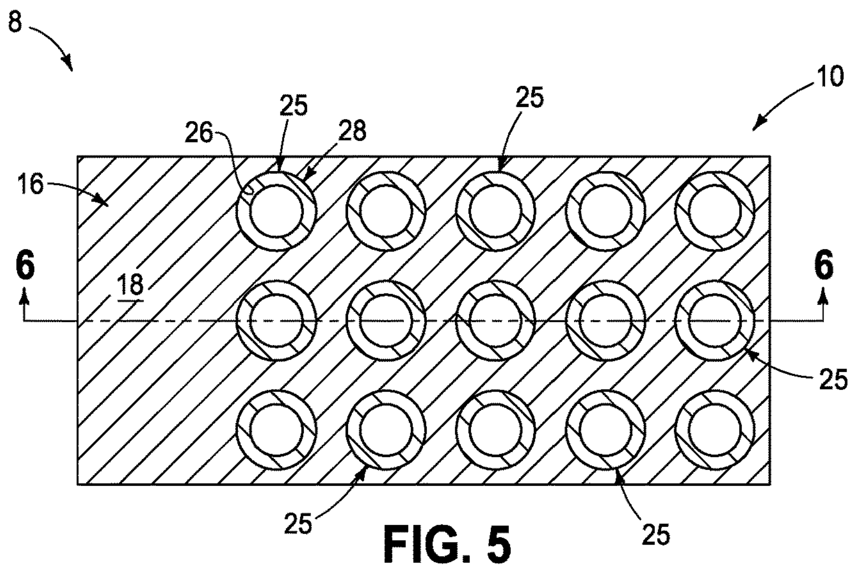
Figure 6:
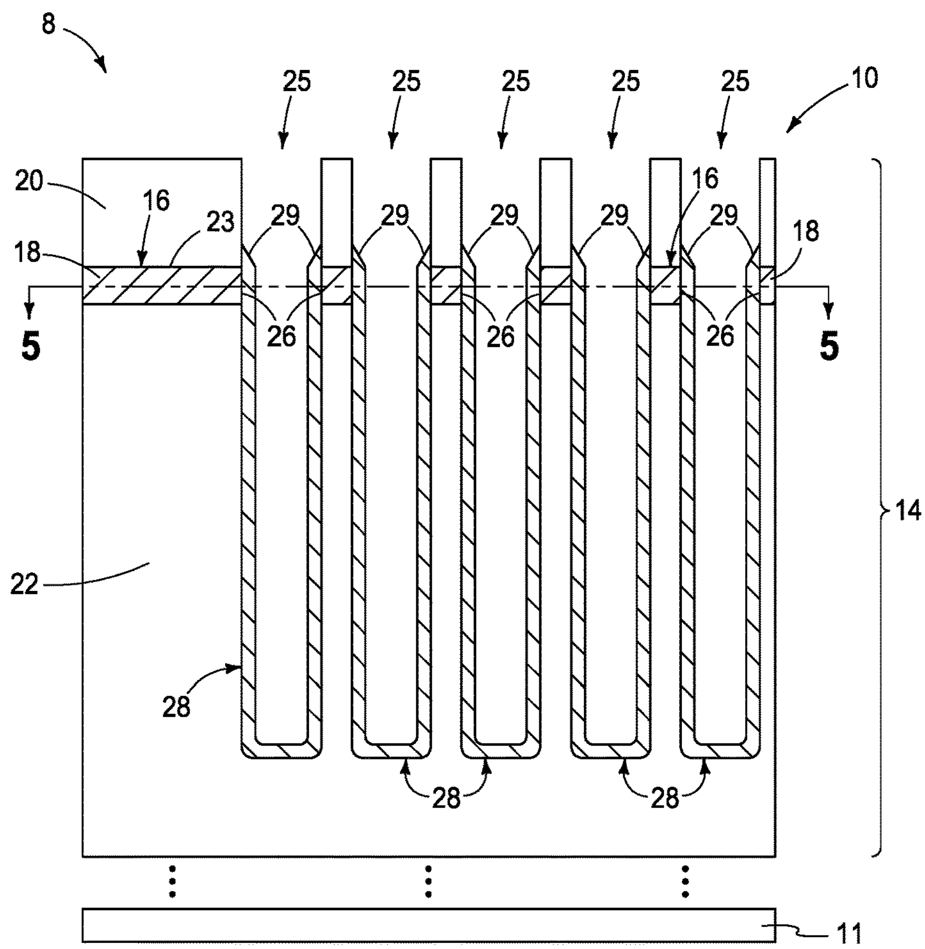

Referring to FIGS. 5 and 6, an upwardly-open container-shaped bottom capacitor electrode 28 (preferred configuration and shape) has been formed in individual openings 25. Bottom capacitor electrode 28 is directly against conductive material 18 of conductive structure 16, with conductive structure 16 directly electrically coupling bottom capacitor electrodes 28 together. In one embodiment and as shown, individual bottom capacitor electrodes 28 are formed directly against at least one lateral side surface 26, in one such embodiment against multiple lateral side surfaces 26, of conductive material 18 of conductive structure 16. Bottom capacitor electrodes 28 in one embodiment may be considered as having tops or top surfaces 29 that are higher than top surfaces 23 of conductive material 18 of portions of conductive structure 16 that are immediately-laterally-adjacent thereto, and in one such embodiment where top surfaces 29 are not horizontally-planar. An example manner of forming bottom capacitor electrodes 28 is depositing a lining layer of conductive material in openings 25 and atop material 20 followed by filling the remaining volume of openings 25 with sacrificial material. The sacrificial material is removed sufficiently to expose the conductive material yet leave at least the bottom of such material in openings 25 covered thereby. The conductive material is then removed back to produce individual bottom capacitor electrodes 28, followed by removal of the sacrificial material.

Figure 7:
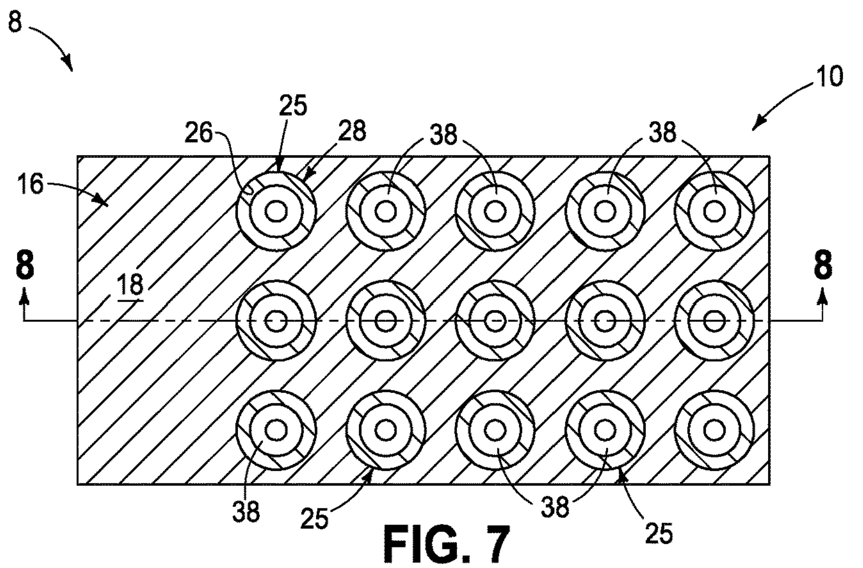
Figure 8:
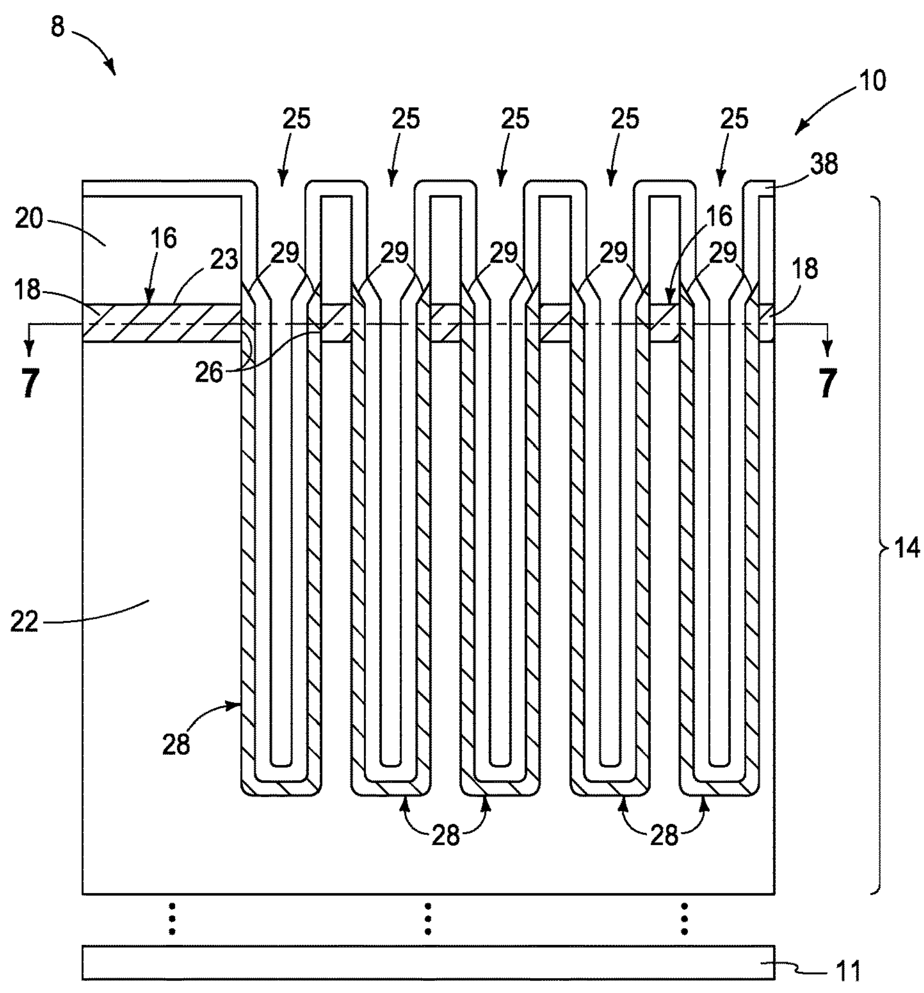

Referring to FIGS. 7 and 8, a capacitor insulator 38 has been formed in openings 25 laterally-inward of bottom capacitor electrodes 28. Capacitor insulator 38 may or may not be programmable (e.g., being ferroelectric, antiferroelectric, ferromagnetic, phase change material, etc.). In one embodiment, capacitor insulator 38 has been formed directly above top surfaces 29 of bottom capacitor electrodes 28, in one such embodiment directly there-against.

Figure 9:
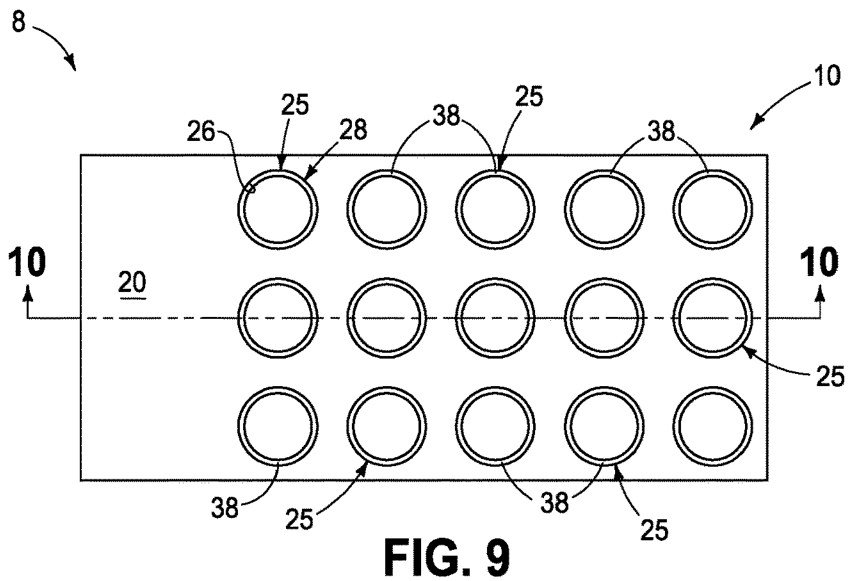
Figure 10:
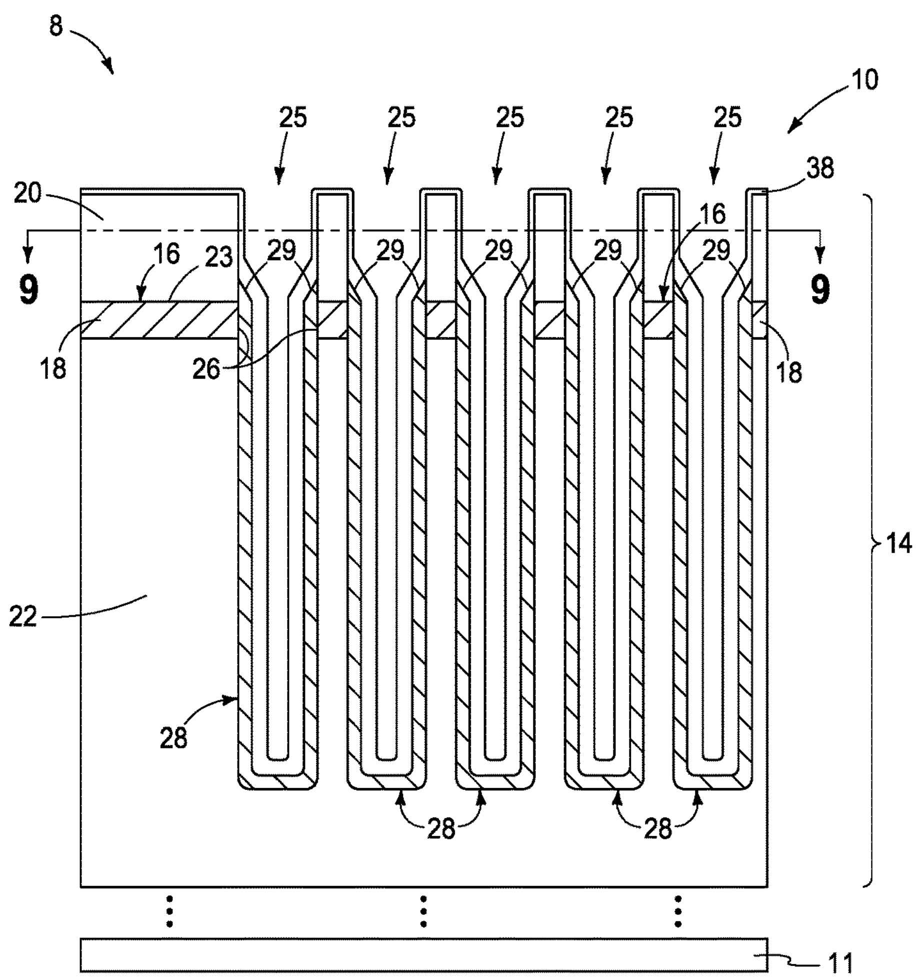

FIGS. 9 and 10 show optional lateral-thinning of capacitor insulator 38 above top surfaces 29 of bottom capacitor electrodes 28. Such may be conducted by, for example, filling remaining volume of openings 25 with sacrificial material, planarizing/etching such back into openings 25 to uppermost portions of the depicted top widest regions of capacitor insulator 38, followed by dry or wet isotropic etching of capacitor insulator 38 to thin it above the sacrificial material, and then removal of the sacrificial material. Such thinning may be desired to increase critical-dimension size (i.e., horizontal target area) of top capacitor electrodes (described below) when forming individual electronic components (e.g., transistors) to such top capacitor electrodes.

A top capacitor electrode is formed in individual openings 25 laterally-inward of capacitor insulator 38, with such top capacitor electrodes not being directly electrically coupled together. An example technique is shown and described with reference to FIGS. 11-14.

Figure 11:
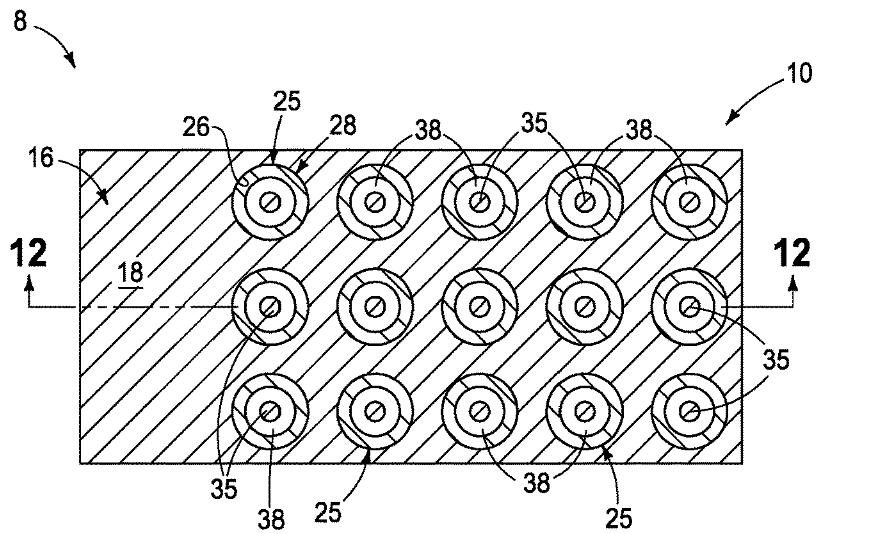
Figure 12:
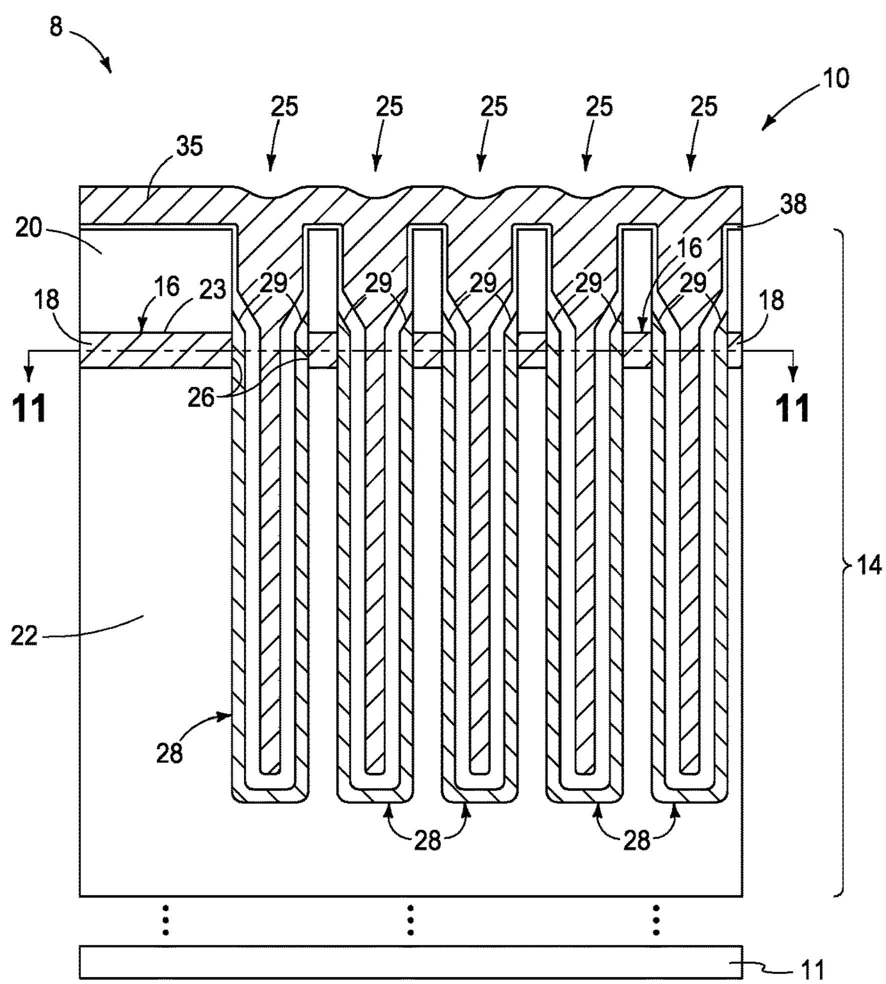

Referring to FIGS. 11 and 12, conductive material 35 has been formed to fill remaining volume of openings 25 and atop insulator material 20. Conductive material 35 may be of the same or different composition(s) as either material of bottom capacitor electrodes 28 or conductive material 18.

An example conductive material 35 is a thin TiN liner (not shown) with remaining volume thereof being elemental tungsten.

Figure 13:
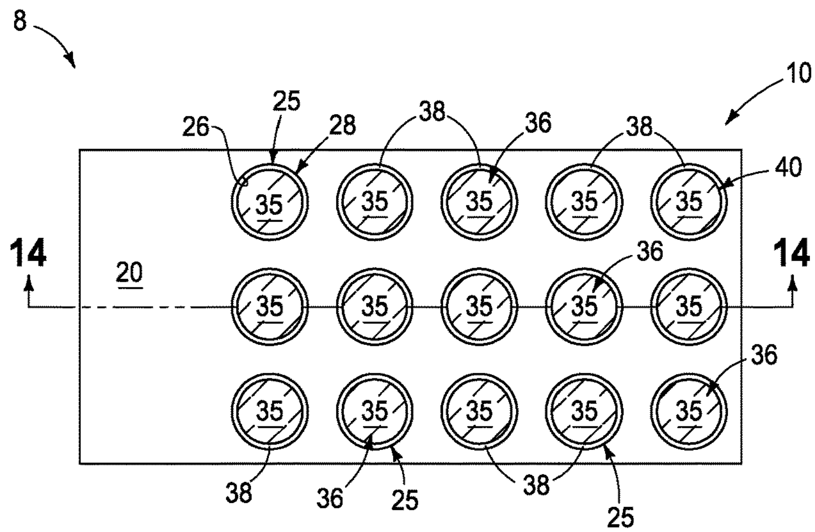
Figure 14:
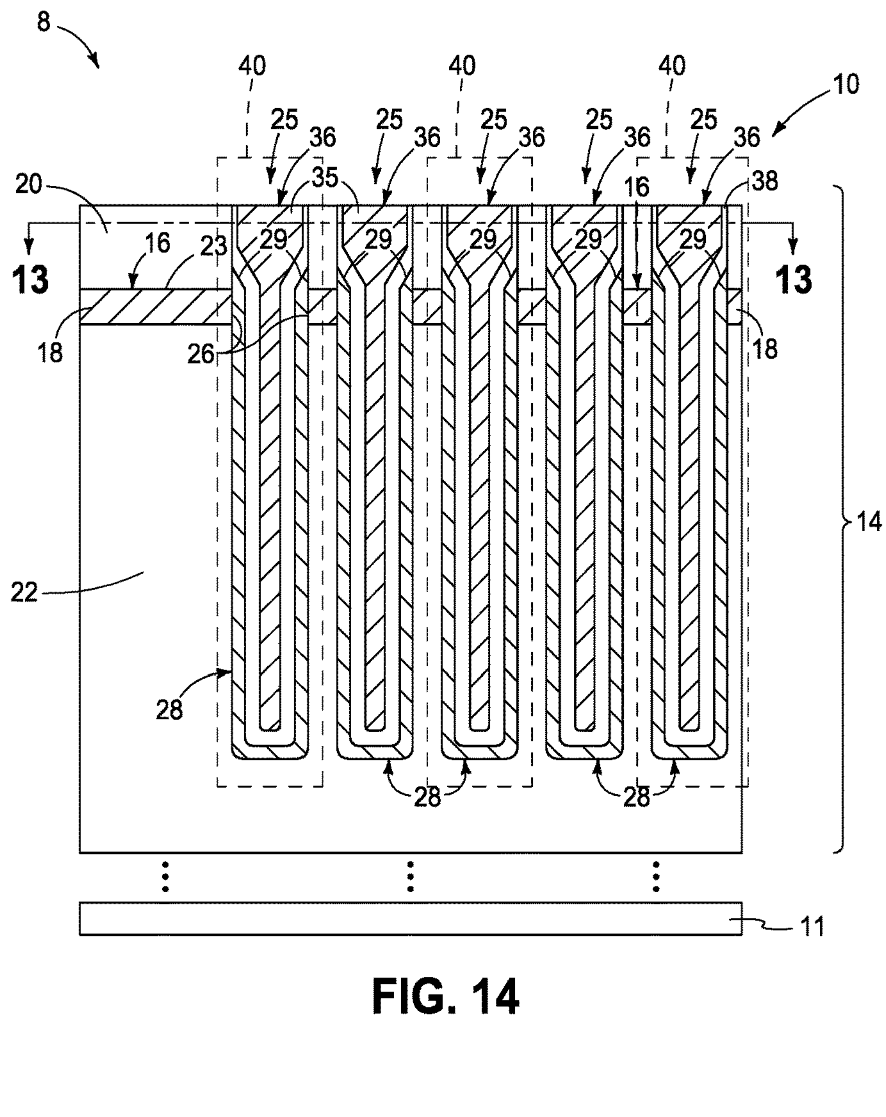

FIGS. 13 and 14 show example subsequent processing whereby conductive material 35 has been planarized back at least to an elevationally-outermost surface of insulator material 20, thus forming top capacitor electrodes 36 in individual openings 25 laterally-inward of capacitor insulator 38. Capacitors 40 are formed thereby, where bottom capacitor electrodes 28 of individual capacitors 40 are directly electrically coupled together by conductive structure 16. Only a few capacitor outlines are shown in FIG. 14 (and in subsequent figures) for clarity. Conductive material 35 may be vertically-recessed within openings 25 (not shown). Conductive structure 16 may be connected to suitable circuitry (not shown) for example to provide desired common voltage(s) to bottom capacitor electrodes 28 as opposed to allowing their voltage to float. Alternately or additionally, such circuitry may facilitate programming and erasing of capacitors 40 if such are reversibly programmable (e.g., if capacitor insulator 38 is programmable, e.g., ferroelectric).

The above are but example methods of forming an array of capacitors. Such array may or may not comprise part of memory circuitry, and individual capacitors may or may not comprise part of a memory cell of an array of memory cells. Accordingly, and regardless, processing and formation of integrated circuitry structure may occur before or after processing as shown and described above in further fabrication of integrated circuitry incorporating example capacitors 40. In one embodiment, a method in accordance with the invention forms an array of memory cells that comprises forming an array of capacitors as described above. Thereafter, a plurality of vertical transistors is formed above the plurality of capacitors, with the vertical transistors individually comprising a top source/drain region, a bottom source/drain region, and a channel region vertically there-between. Individual of the bottom source/drain regions are directly electrically coupled to individual of the top capacitor electrodes. An example such method is shown and described with reference to FIGS. 15-23.

Figure 15:
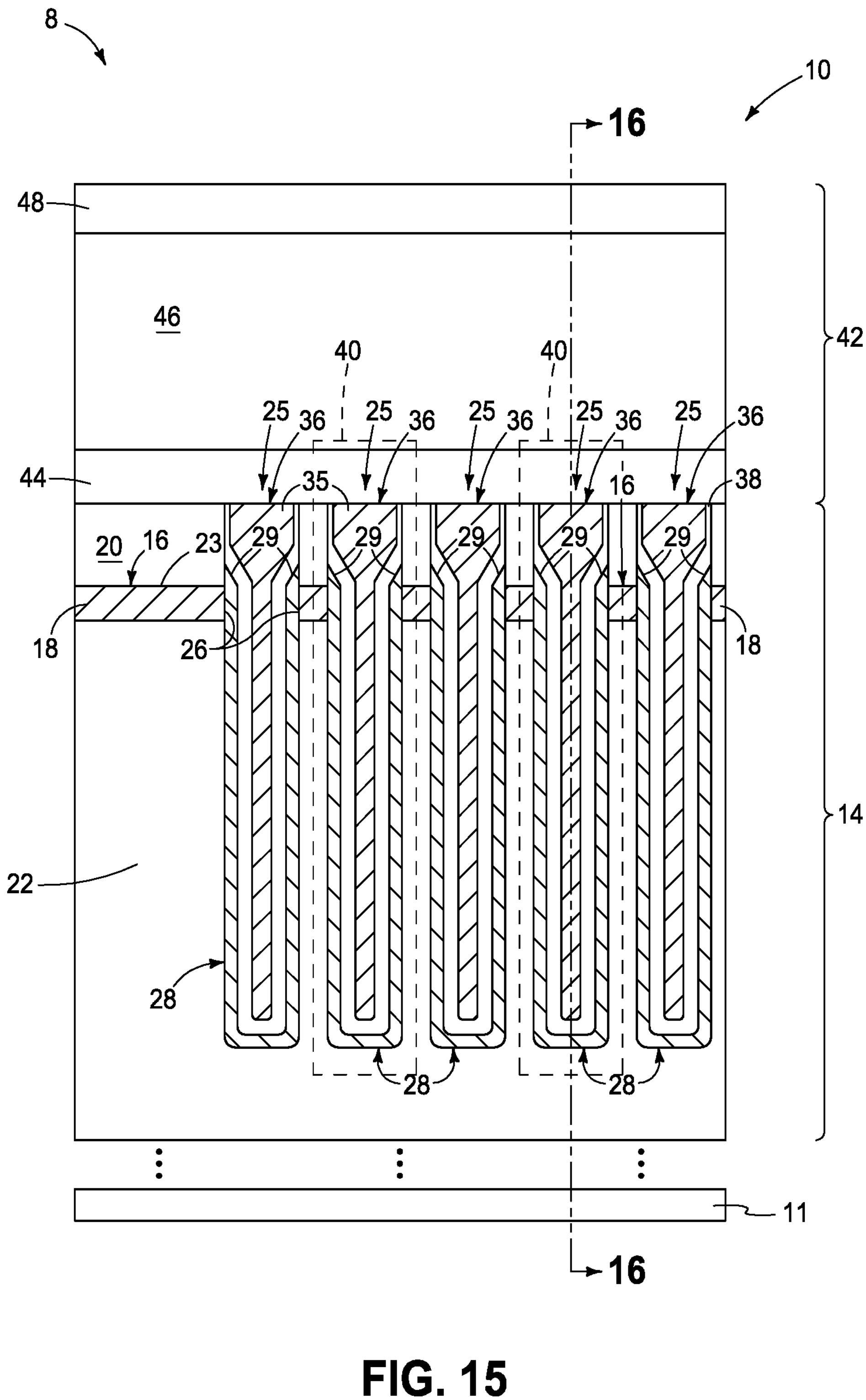
Figure 16:
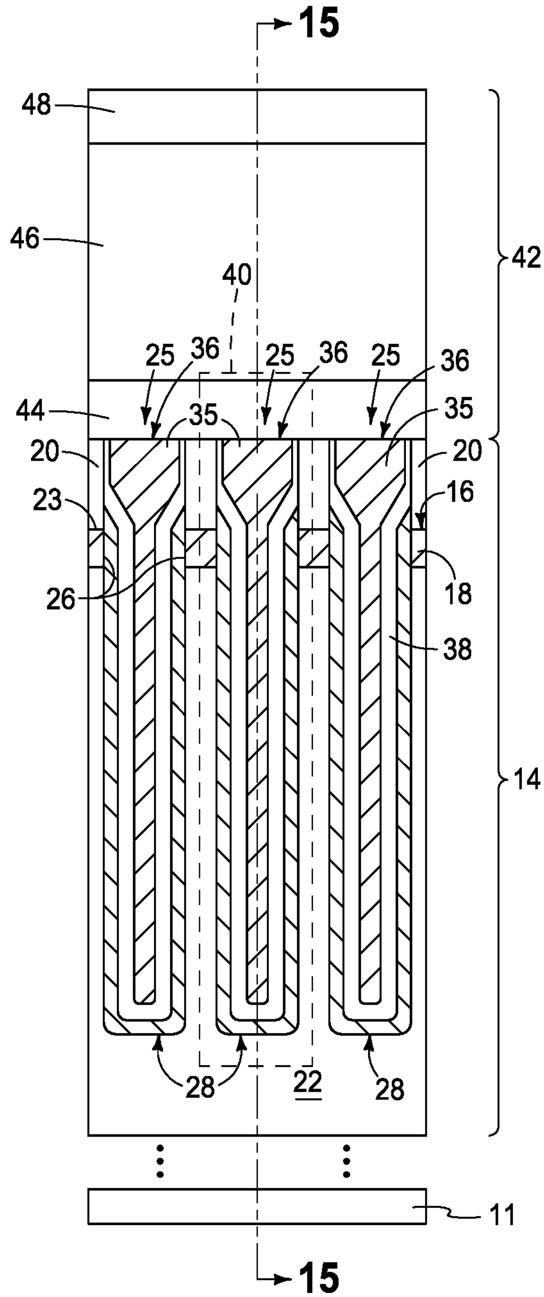

Referring to FIGS. 15 and 16, transistor material 42 has been formed atop the example structure of FIGS. 13 and 14. By way of example only, such is shown as comprising bottom source/drain material 44, channel material 46, and upper source/drain material 48. Any existing or future-developed appropriate materials may be used. Transistor material 42 will be used to form source/drain regions and a channel region vertically there-between and may or may not be of appropriate doping and/or conductivity at this point in processing. Regardless, and by way of example only, an alternate embodiment includes conductive material 35 of top capacitor electrodes 36 being vertically recessed (not shown) within openings 25 prior to forming transistor material 42. Bottom source/drain material 44 would then fill remaining volume of openings 25 (not shown) and may be planarized back. If so, material 46 of the ultimate channel regions would be formed directly against top surfaces of insulator material 20 (not shown) and source/drain material 44 in top-most portions of openings 25 (not shown).

Figure 17:
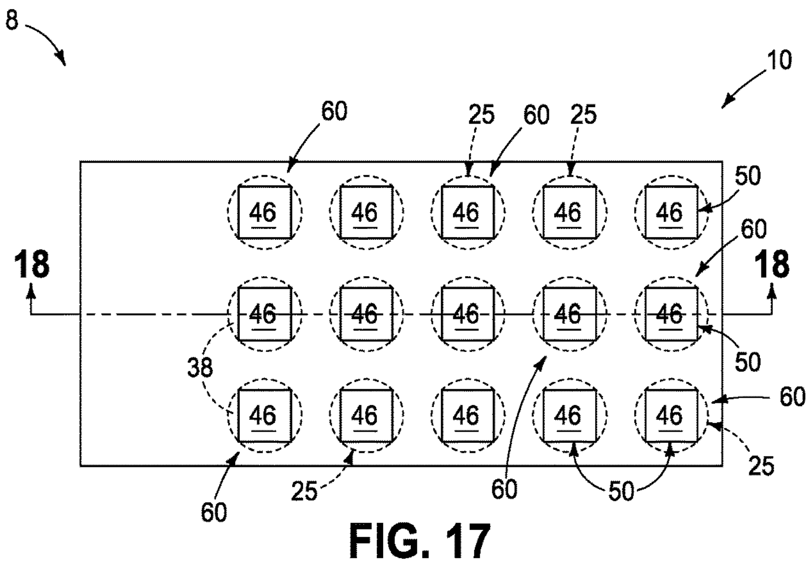
Figure 18:
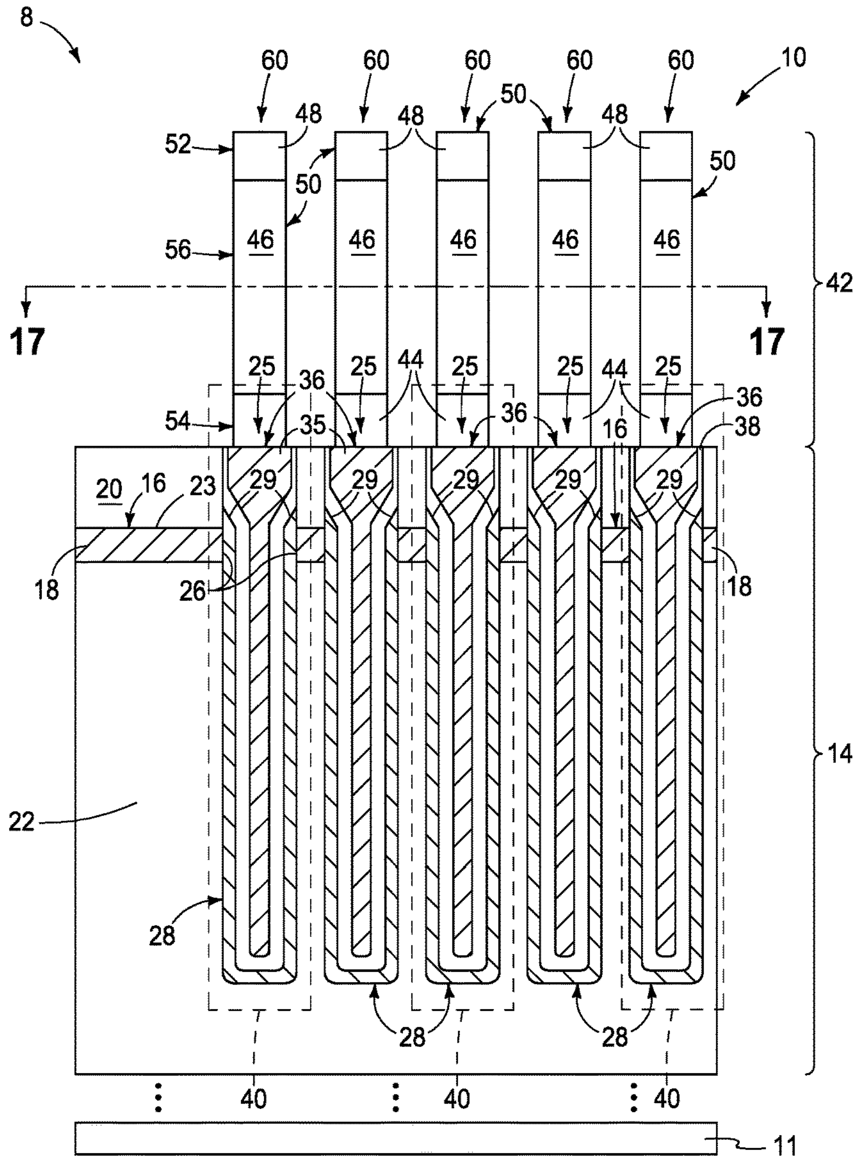

Referring to FIGS. 17 and 18, and in one embodiment, transistor material 42 has been patterned to form a top source/drain region 52 of material 48, a bottom source/drain region 54 of material 44, and a channel region 56 of material 46, thereby forming vertical transistors 60. Individual bottom source/drain regions 54 are directly electrically coupled to individual top capacitor electrodes 36. In the depicted example embodiment, top source/drain region 52, bottom source/drain region 54, and channel region 56 comprise or are encompassed by a vertically-elongated pillar 50. Vertically-elongated pillars 50 may be formed using pitch multiplication, for example using two pitch-multiplication masking steps and spacer deposition steps.

Figure 19:
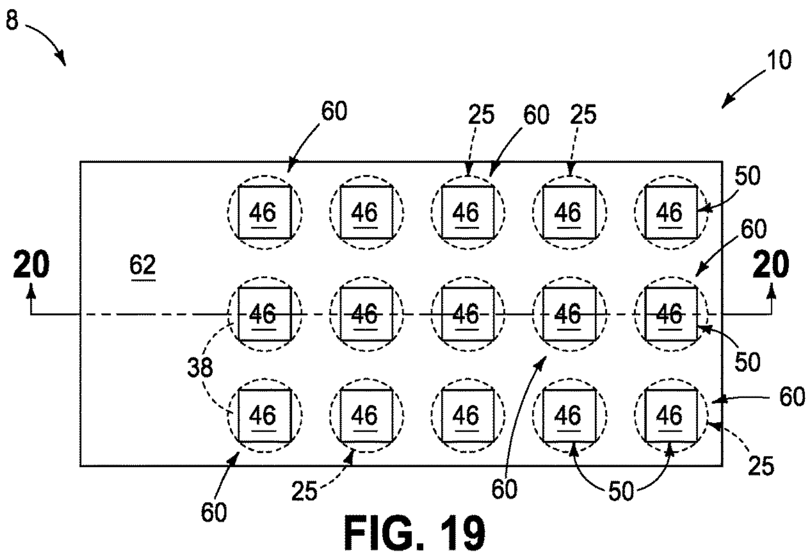
Figure 20:
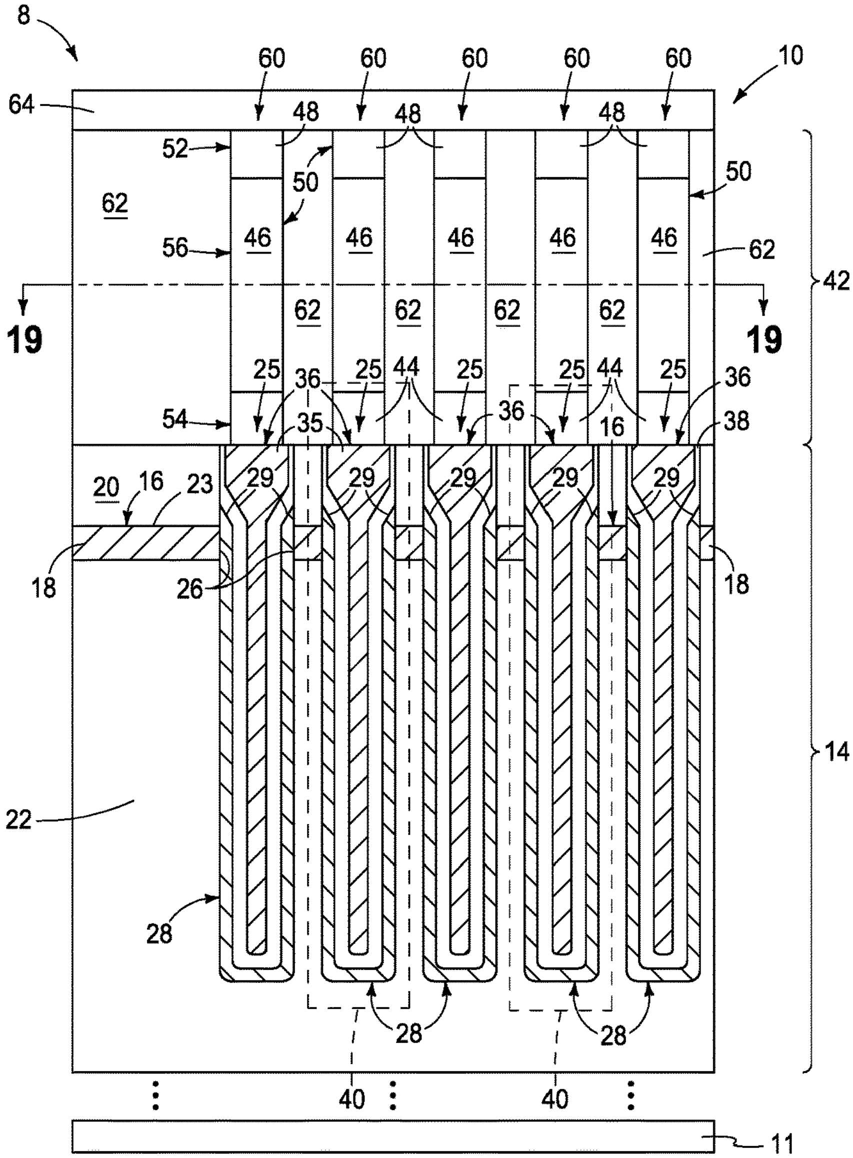

Referring to FIGS. 19 and 20, and optionally, example insulating materials 62 and 64 (e.g., silicon dioxide and silicon nitride, respectively) have been formed to surround and cap transistors 60.

Figure 21:
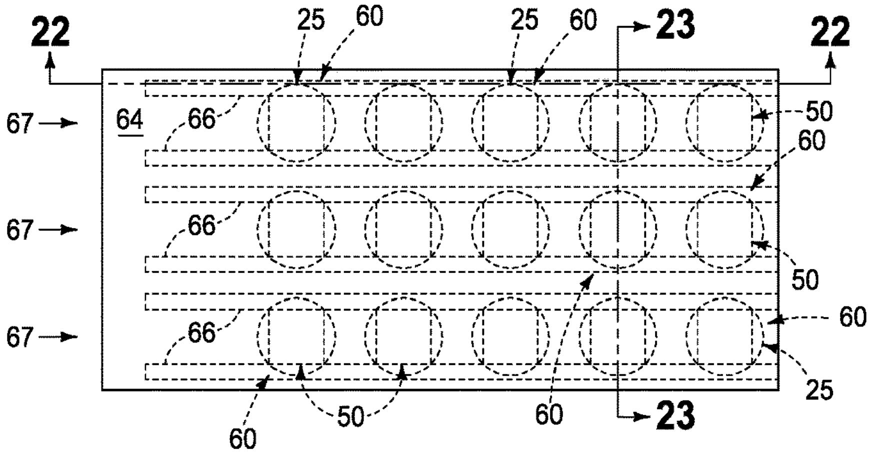
Figure 22:
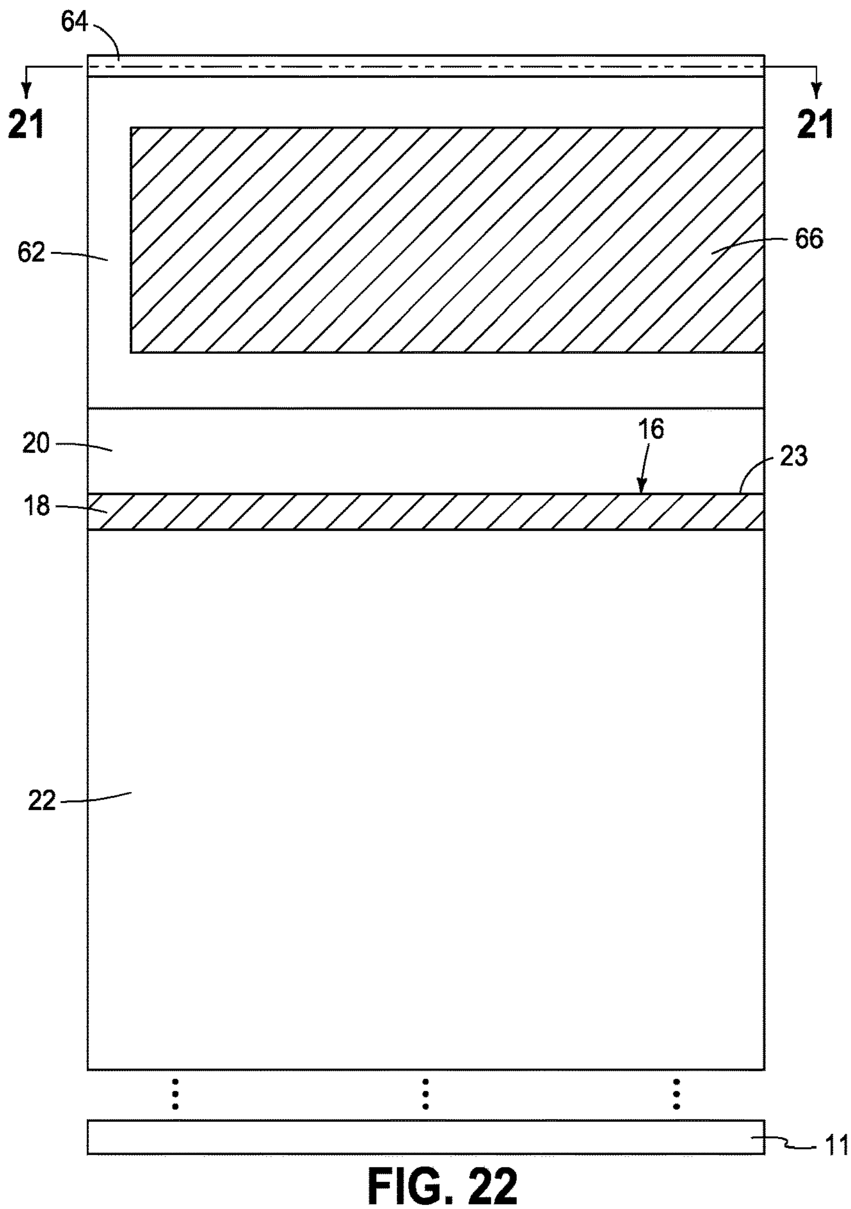
Figure 23:
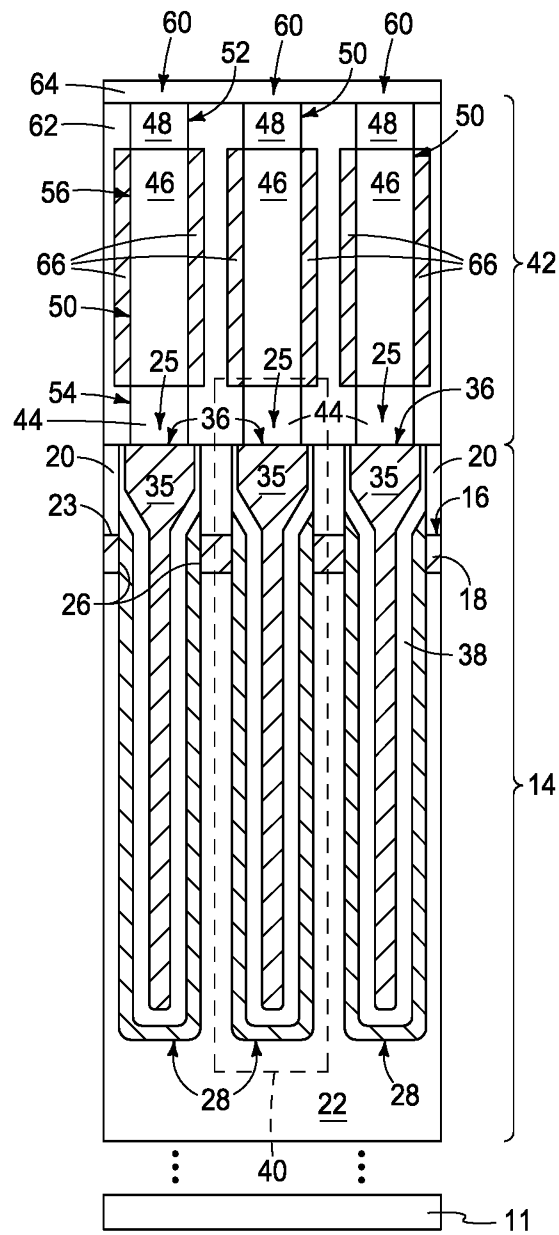
Figure 24:
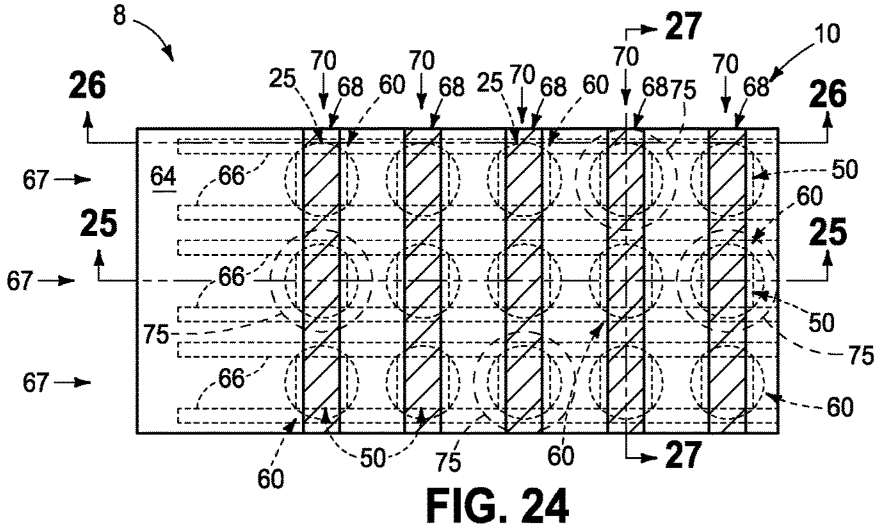
Figure 25:
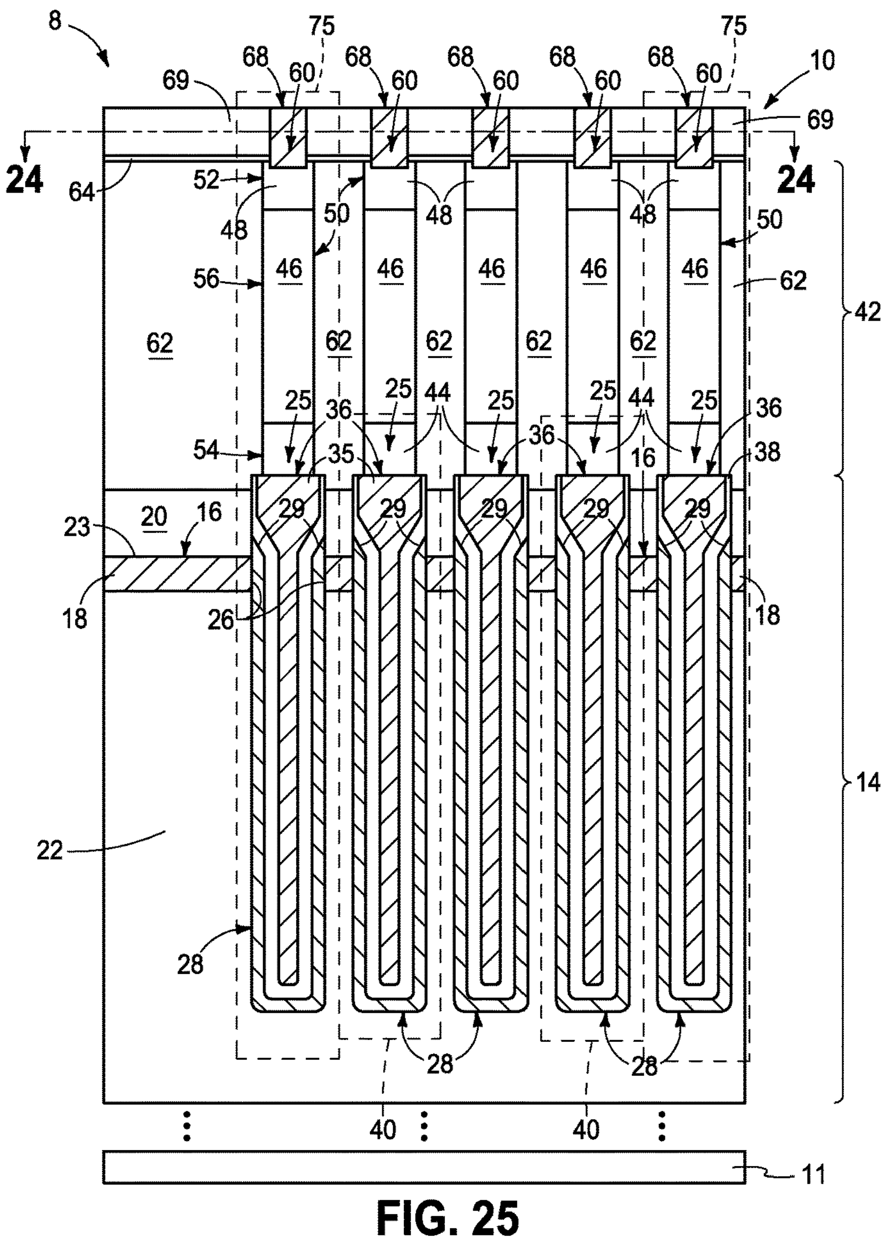
Figure 26:
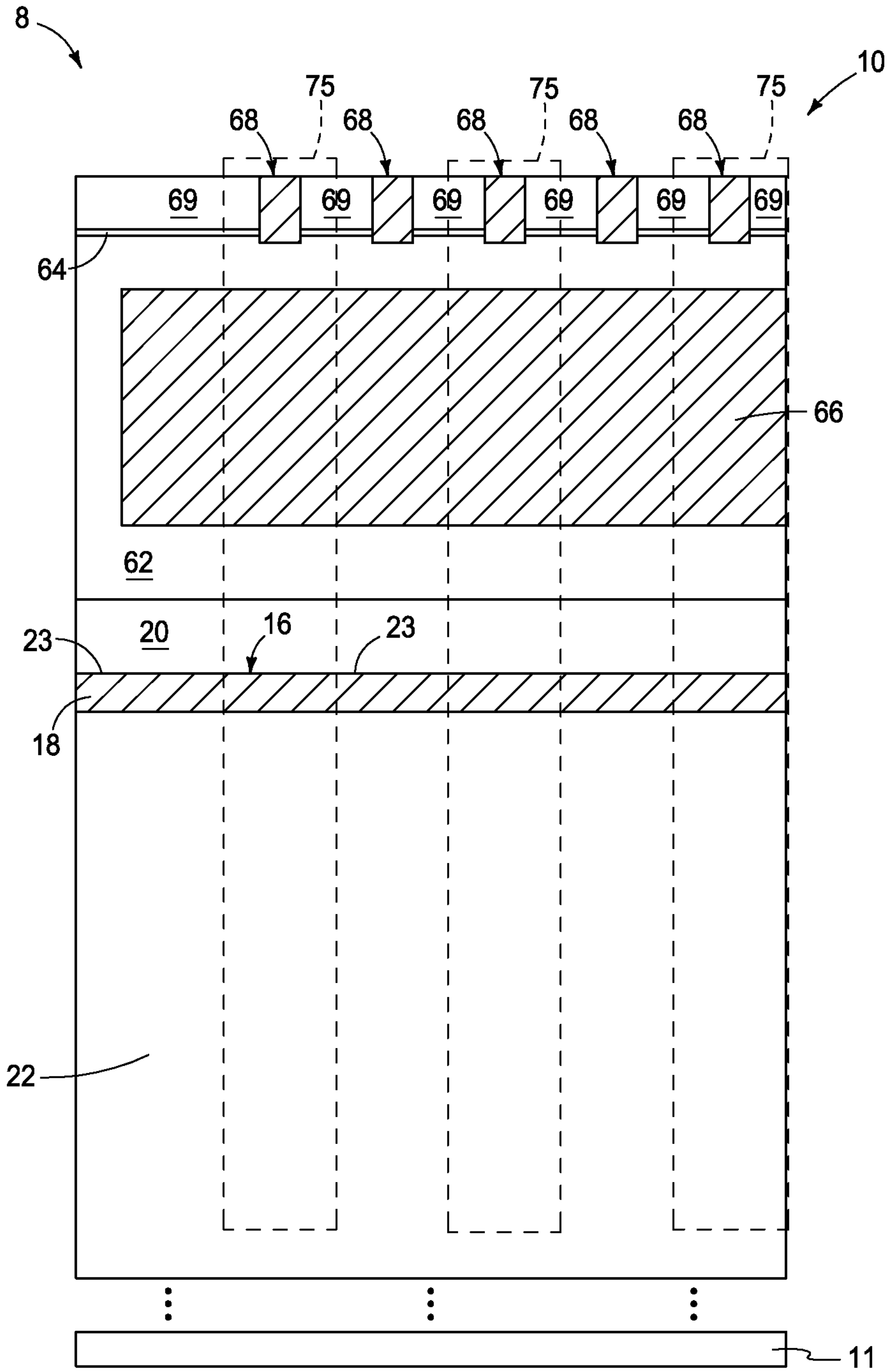
Figure 27:
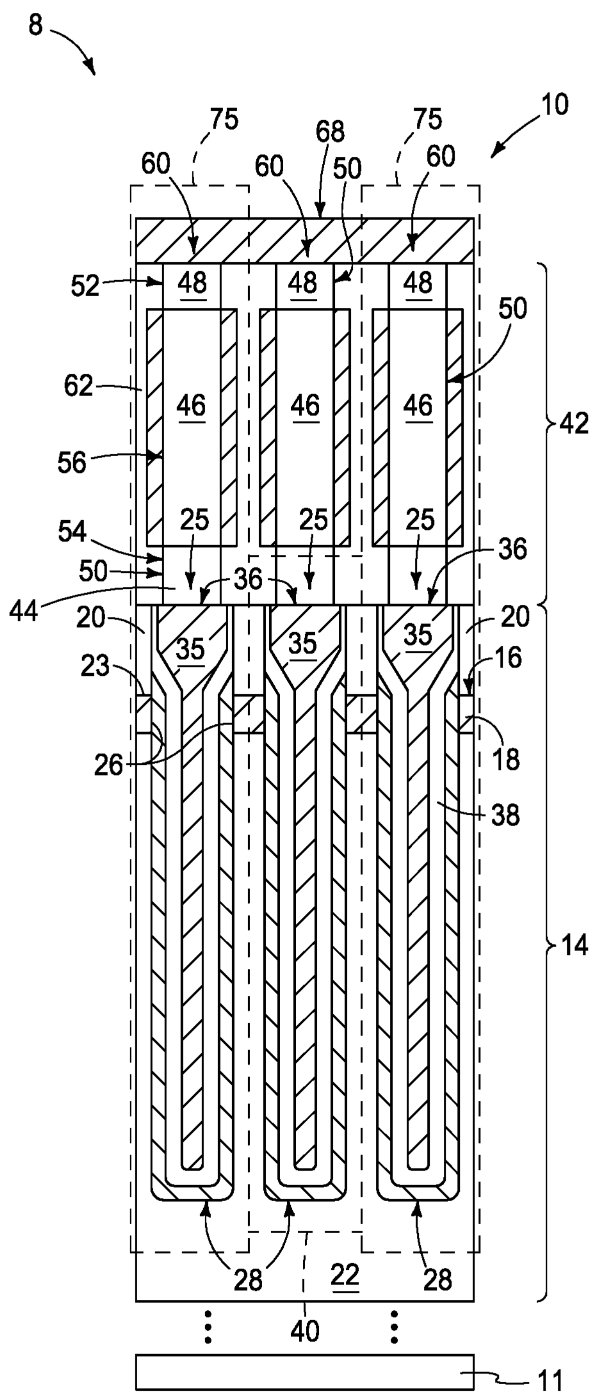

FIGS. 21-23 show subsequent processing whereby conductive gate lines 66 have been formed and that interconnect multiple vertical transistors 60 in individual rows 67. Gate insulator (not shown due to scale and for better clarity in FIGS. 21-23) would be laterally between conductive gate lines 66 and channel regions 56. Any suitable existing or future-developed methods may be used to form the example construction of FIGS. 21-23. As an example, horizontally elongated trenches (not shown) could be formed in the row direction between immediately-column-adjacent pillars. Insulator or sacrificial material (not shown) could be formed in the trenches to have top surfaces where the bottom surfaces of the conductive gate lines 66 are to be. A layer of the conductive material of the conductive gate lines would then be deposited to line the trenches, with such then being anisotropically etched back in a spacer-forming-like manner to substantially remove such from horizontal surfaces and form the depicted conductive gate lines 66. If sacrificial material was used, it could now be removed. Regardless, insulating material 62 (e.g., silicon dioxide and/or silicon nitride) could be deposited to fill remaining volume of the trenches. The FIGS. 21-23 example shows a two-sided gate construction relative to individual channel regions 56. Alternately, a gate-all-around construction or a single-sided gate construction may be used.

FIGS. 24-27 show example subsequent processing where conductive digitlines 68 have been formed in columns 70 and that interconnect multiple vertical transistors 60 in individual columns 70. In one example embodiment, such forms example memory cells 75 which may comprise DRAM circuitry, for example comprising a one transistor 60-one capacitor 40 (1T-1C) memory cell 75. Only a few memory cell outlines 75 are shown in FIGS. 24-27 for clarity. Alternately, by way of example only, and regardless of fabrication of DRAM, a memory cell may be considered as an individual capacitor 40 alone (e.g., where capacitor insulator 38 is reversibly programmable and capacitor 40 is non-volatile, with individual transistors 60 being or functioning as a select device).

Any other attribute(s) or aspect(s) as shown and/or described herein with respect to other embodiments may be used.

The above example processing shows but one example embodiment where conductive gate lines 66 and digit lines 48 are formed after completing formation of pillars 50. Alternately, as an example, the conductive gate lines may be formed before completing formation of such pillars, for example as is described with fabrication of an alternate embodiment construction 8*a* comprising an array 10*a* as shown in FIGS. 28-37. Like numerals from the above-described embodiments have been used where appropriate, with some construction differences being indicated with the suffix "a" or with different numerals.

Figure 28:
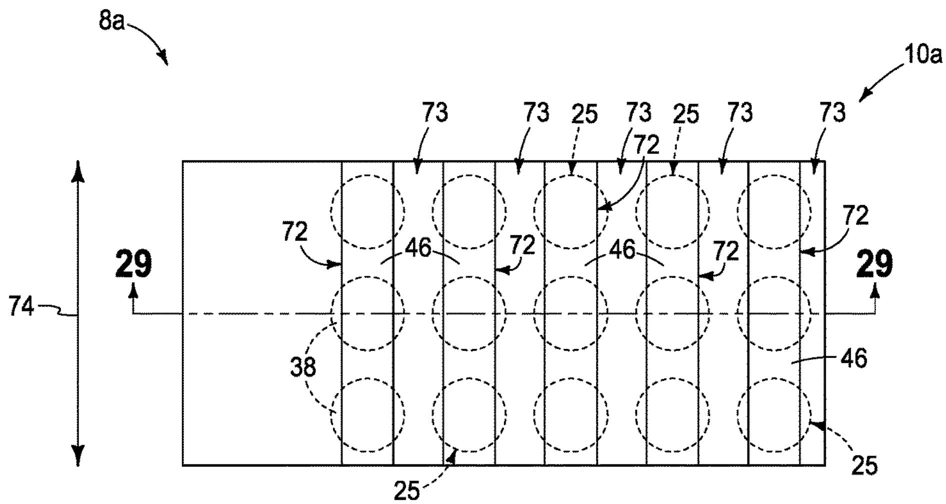
FIG. 28 is a diagrammatic cross-sectional view of a portion of a substrate in process in accordance with an embodiment of the invention and is taken through line 28-28 in FIG. 29.
Figure 29:
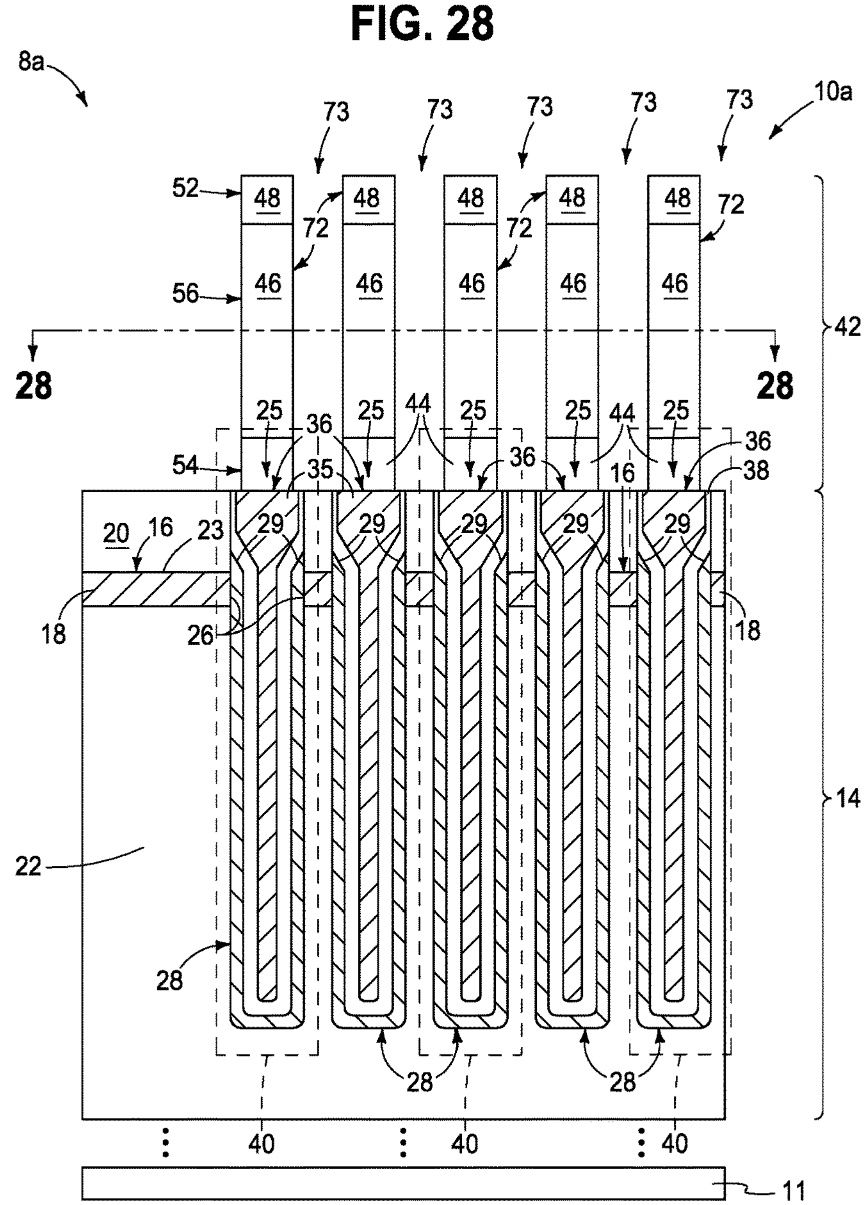
FIG. 29 is a diagrammatic cross-sectional view taken through line 29-29 in FIG. 28.

Referring to FIGS. 28 and 29, such shows processing immediately subsequent to that shown by FIGS. 15 and 16 and alternate to that shown by FIGS. 17 and 18. Etching has been conducted through material 48 of what is or will ultimately be top source/drain regions 52, material 46 of what is or will ultimately be channel regions 56, and material 44 of what is or will ultimately be bottom source/drain regions 54 to form first walls 72 and first trenches 73 laterally there-between. First walls 72 and first trenches 73 are horizontally-elongated in a first direction 74 (e.g., a column direction). Pitch multiplication may or may not be used.

Figure 30:
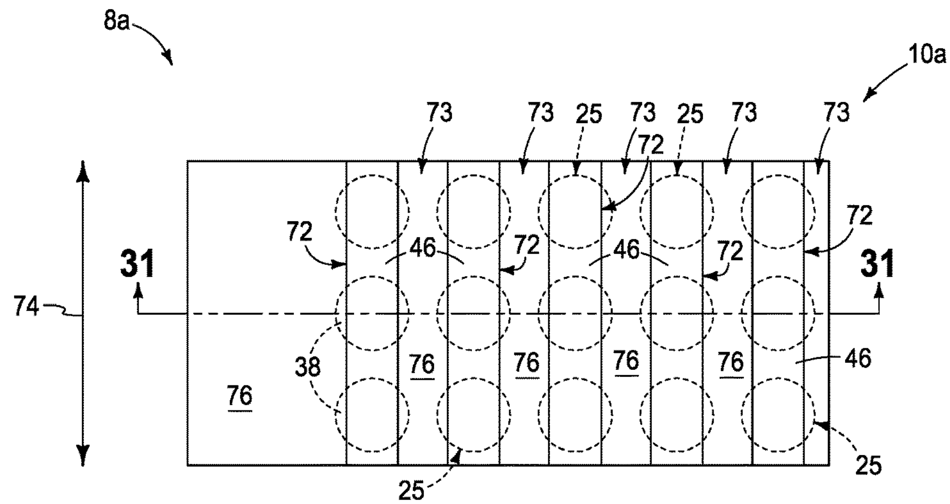
FIGS. 30-37 are diagrammatic sequential sectional and/or enlarged views of the construction of FIGS. 28 and 29, or portions thereof, in process in accordance with some embodiments of the invention.
Figure 31:
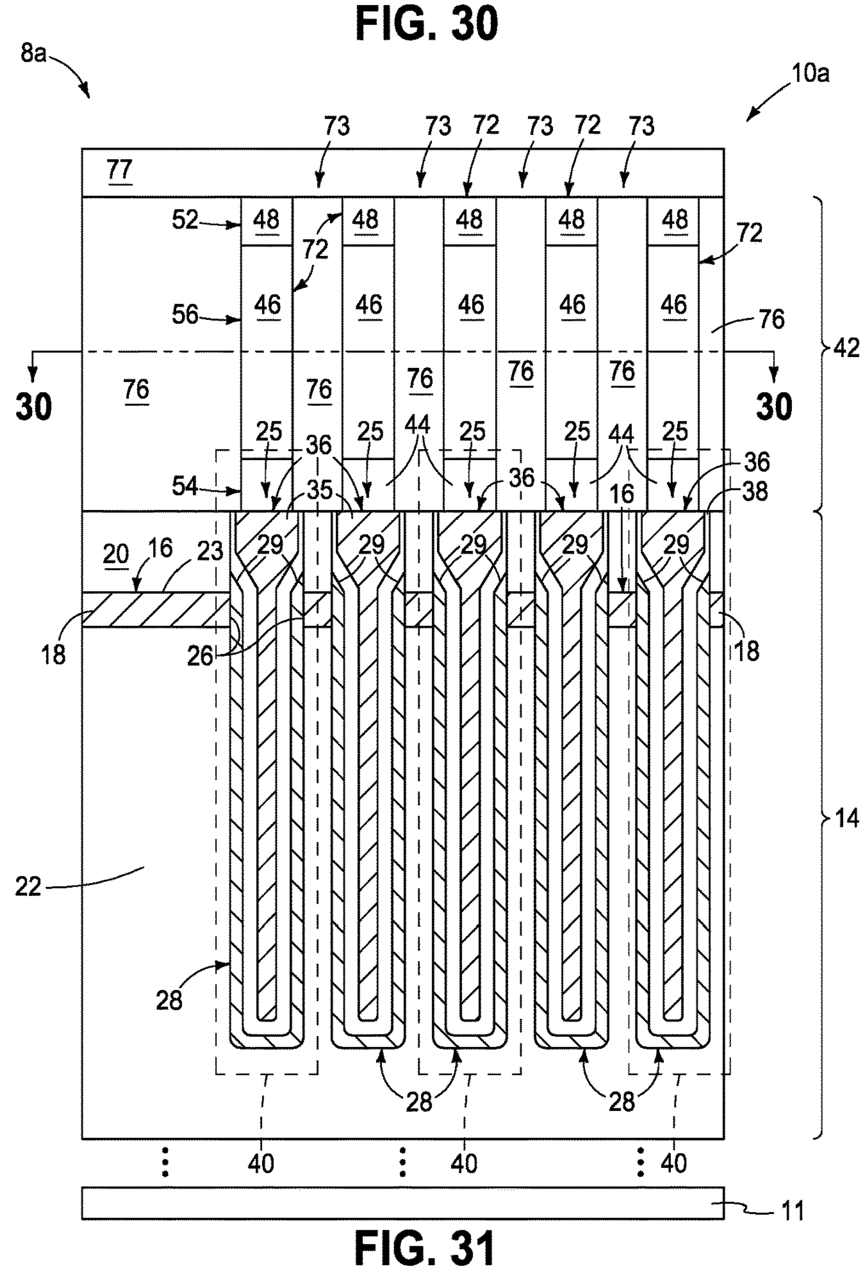

Referring to FIGS. 30 and 31, insulative material 76 (e.g., silicon dioxide) has been formed in first trenches 73 between first walls 72. Hard-masking material 77 (e.g., silicon nitride) has been formed there-atop and atop first walls 72.

Figure 32:
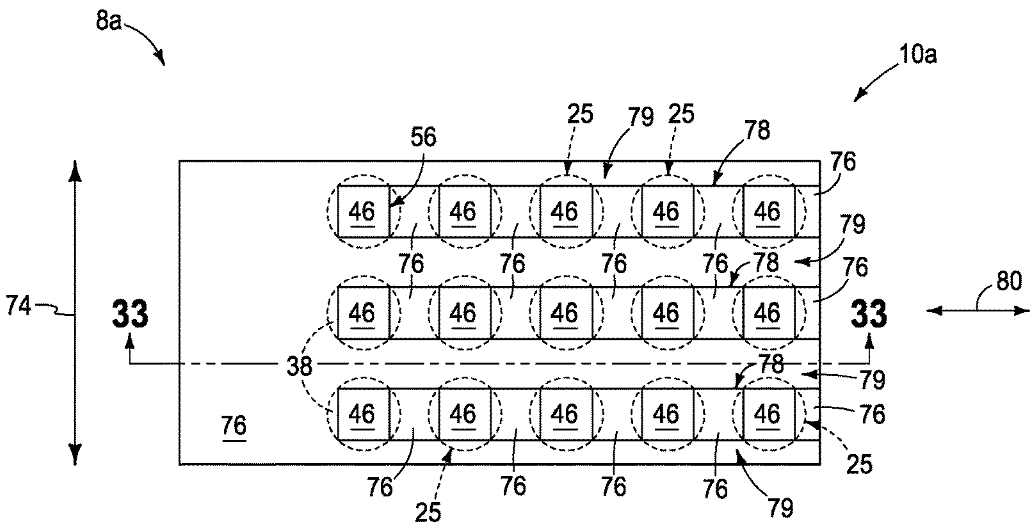
Figure 33:
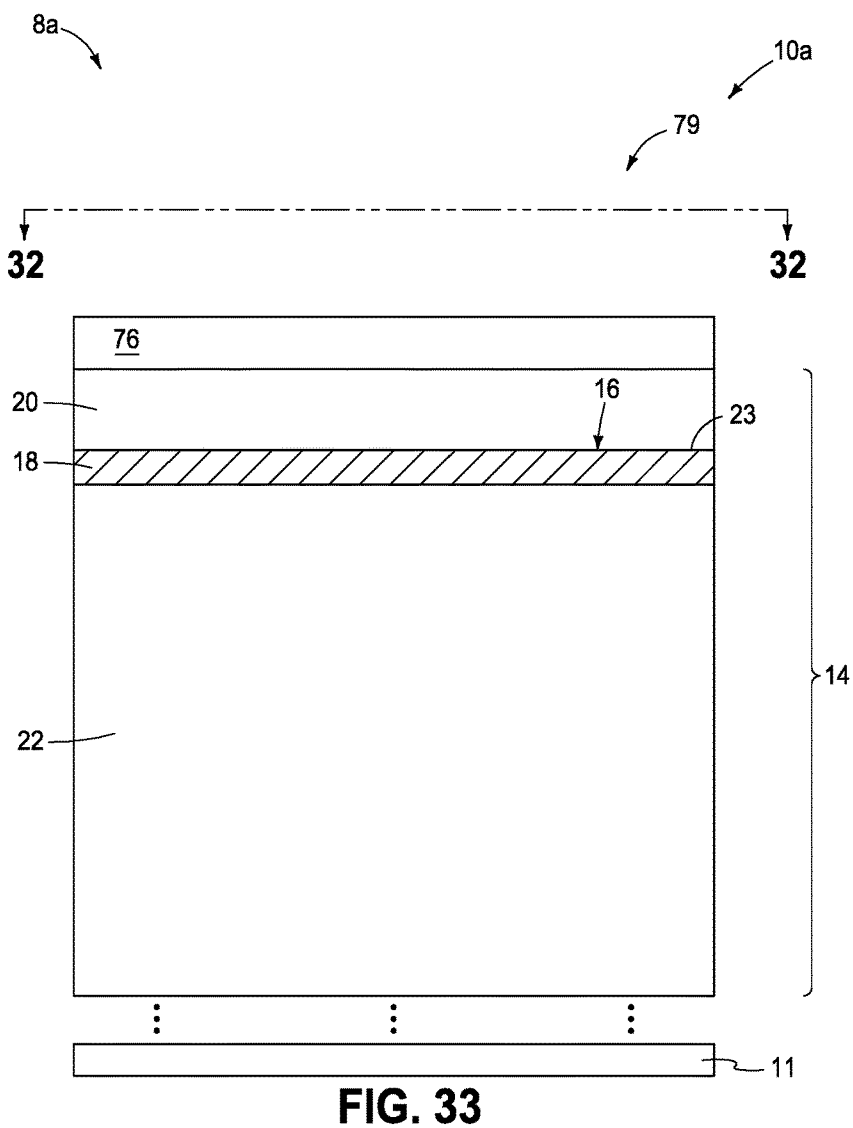

Referring to FIGS. 32 and 33, etching has been conducted into first walls 72 (not numerically designated in FIGS. 32 and 33) through material 48 of top source/drain regions 52, into material 46 of channel regions 56 (in one embodiment there-through), and into materials 76/77 to form second walls 78 and second trenches 79 laterally there-between. Second walls 78 and second trenches 79 are horizontally-elongated in a second direction 80 (e.g., a row direction) that is angled (i.e., other than the straight angle) from first direction 74. By way of example only, first direction 74 and second direction 80 are shown as being angled 90° relative one another, although other non-straight and non-right angles may be used (not shown).

Figure 34:
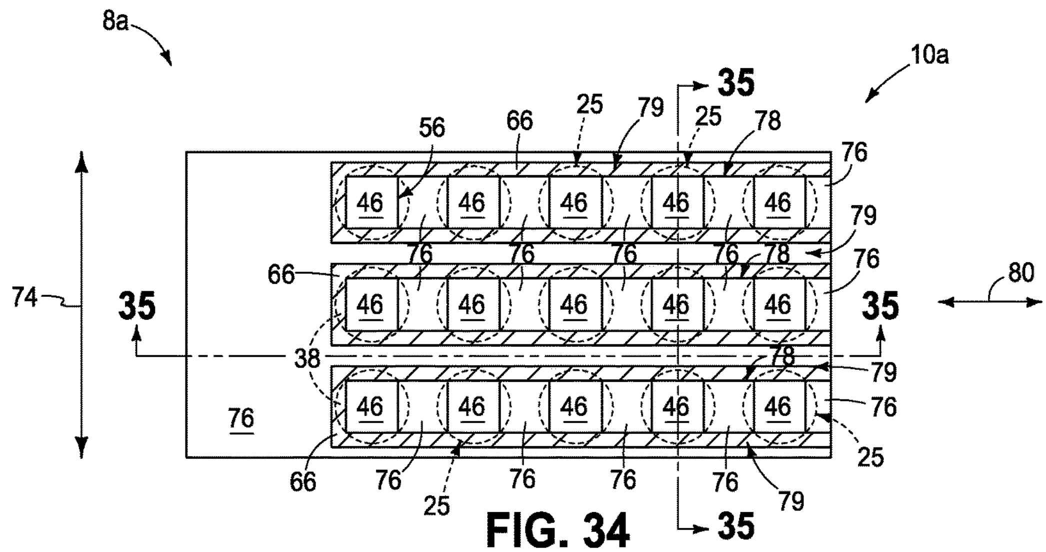
Figure 35:
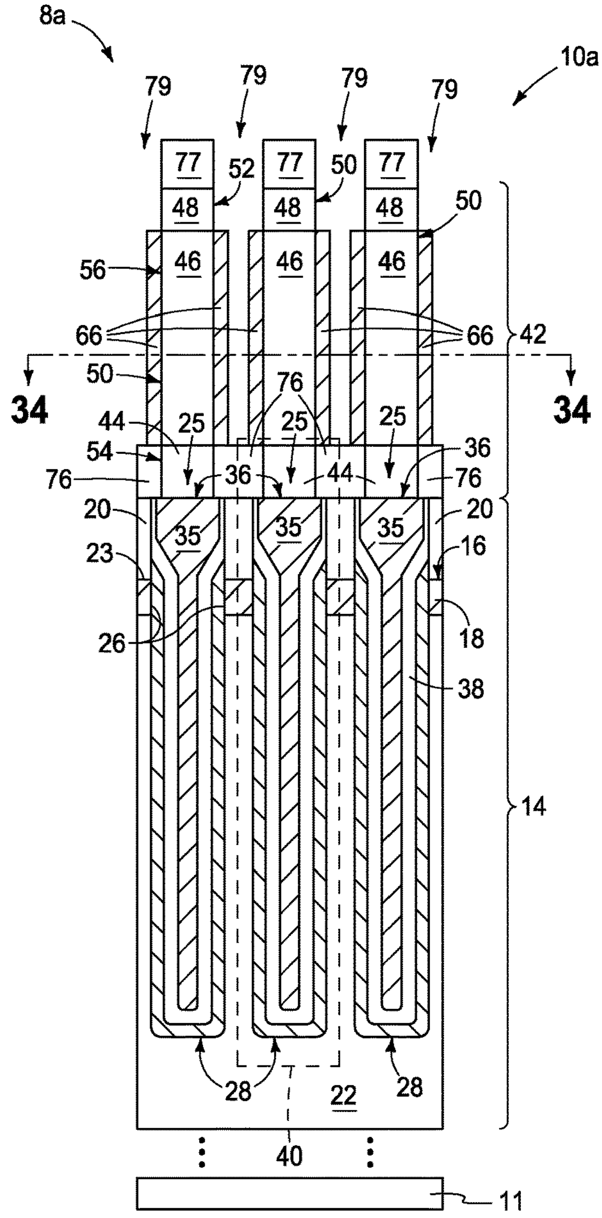

Referring to FIGS. 34 and 35, conductive gate lines 66 have been formed in second trenches 79 operatively-adjacent material 46 of channel regions 56 (gate insulator material that would be present there-between not being shown due to scale and for better clarity in FIGS. 34 and 35).

Figure 36:
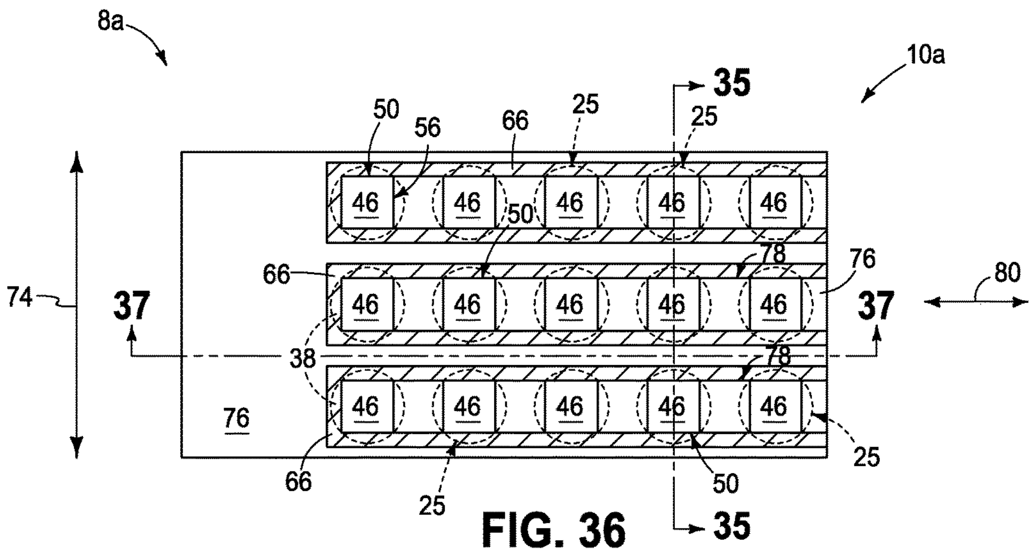
Figure 37:
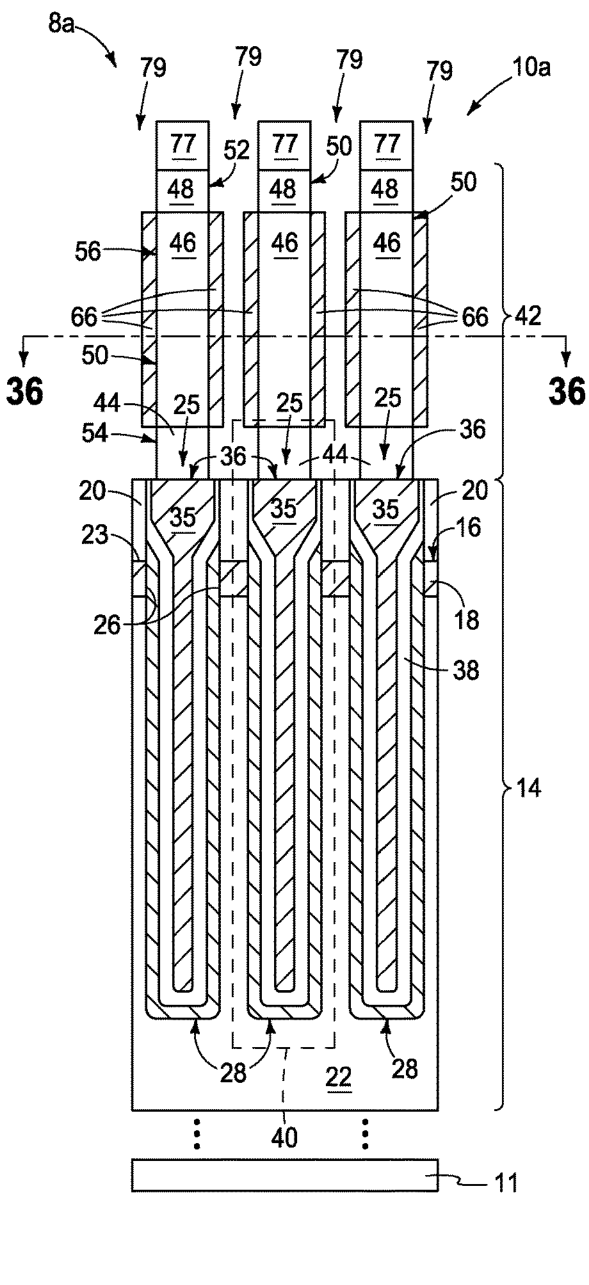

FIGS. 36 and 37 show example subsequent processing where etching has been conducted through more transistor material 42 (e.g., material 44 of bottom source/drain region 54 when present above insulator material 20) to form individual pillars 50.

The etchings of FIGS. 28/29 and 32/33 may be conducted with or without pitch multiplication. If using pitch multiplication in ultimate formation of pillars 50 using two masking steps therefor and another masking step to pattern conductive gate lines 66, the latter of the two pitch multiplication masking steps can be combined with the gate line 66/trench 79 patterning of FIGS. 32/33 thereby saving a masking step compared to the example processing of FIGS. 1-27. Regardless, subsequent processing (not shown) may occur as described above, or otherwise, after FIGS. 36/37.

Any other attribute(s) or aspect(s) as shown and/or described herein with respect to other embodiments may be used.

Figure 38:
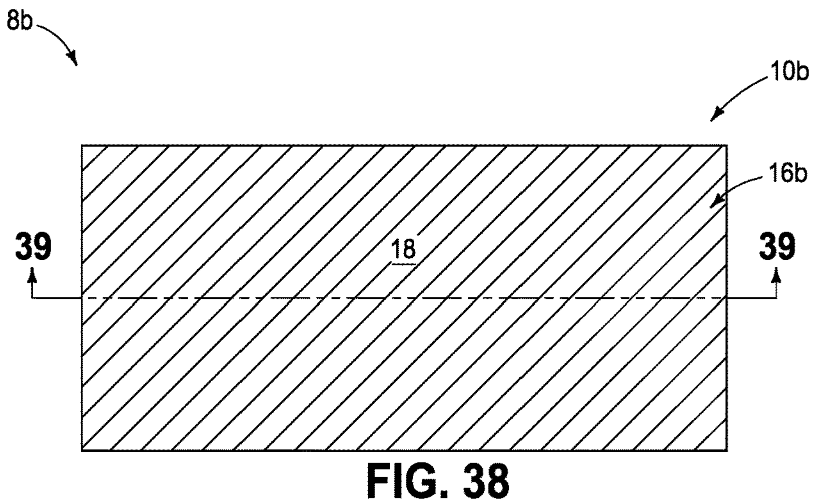
FIG. 38 is a diagrammatic cross-sectional view of a portion of a substrate in accordance with an embodiment of the invention and is taken through line 38-38 in FIG. 38.
Figure 39:
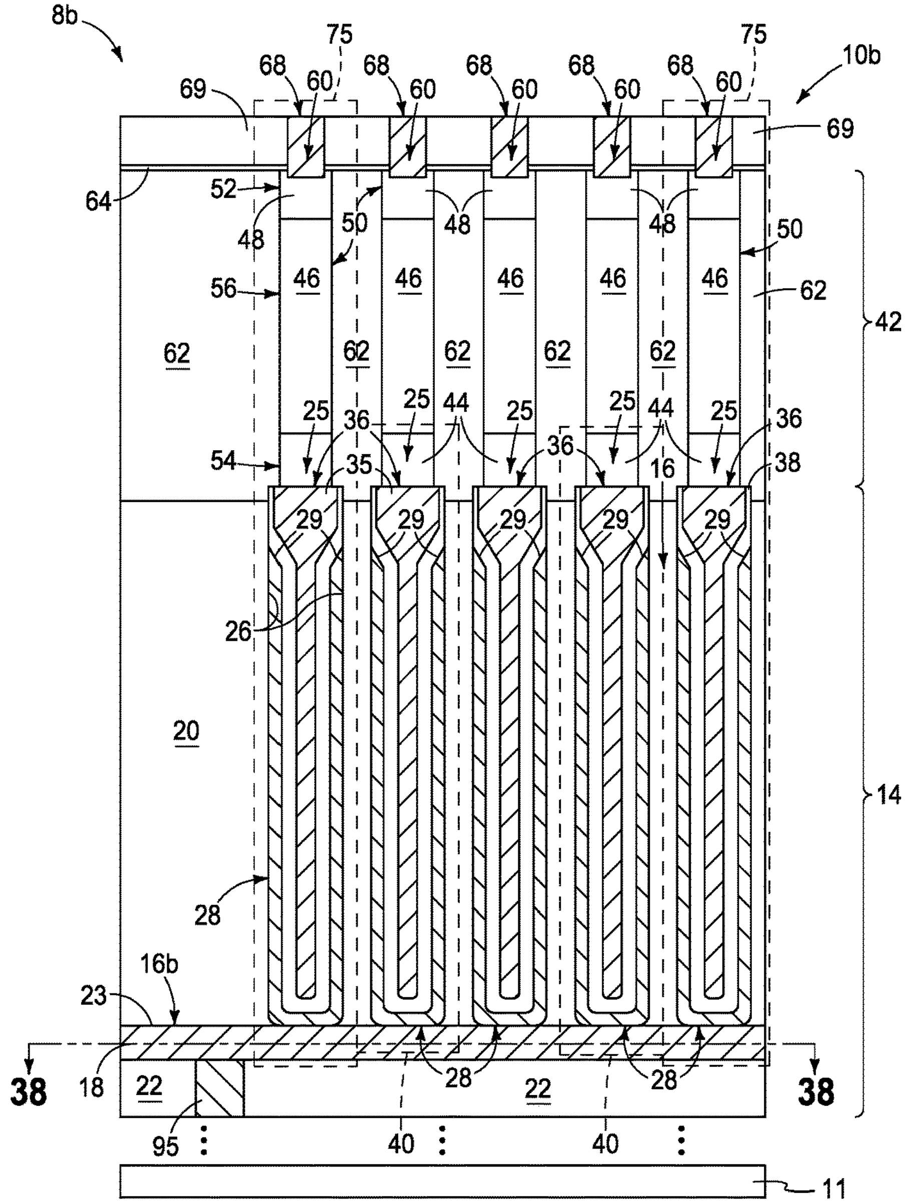
FIG. 39 is a diagrammatic cross-sectional view taken through line 39-39 in FIG. 38.

The above example methods of forming an array of capacitors show forming conductive structure 16 to be proximate tops 29 of bottom capacitor electrodes 28. An alternate example embodiment is described with reference to FIGS. 38 and 39 showing a construction **8*b*. Like numerals from the above-described embodiments have been used where appropriate, with some construction differences being indicated with the suffix “b” or with different numerals. FIGS. 38 and 39 show an alternate construction 8*b* to that shown by FIG. 25 and comprising an array 10*b*. Construction 8*b* has conductive structure 16*b* as having been formed proximate the bottoms of bottom capacitor electrodes 28. FIGS. 38 and 39 also show an example embodiment where individual bottom capacitor electrodes 28 have been formed directly against top surface 23 of conductive material 18 of conductive structure 16*b*. FIGS. 38 and 39 also show an example embodiment where openings 25 have not been formed to extend vertically through conductive material 18 of conductive structure 16*b*. In one such embodiment, and by way of example only, the forming of openings 25 may comprise etching of insulative material 20 there-above selectively relative to and to finally stop on (i.e., atop or within) conductive material 18 of conductive structure 16*b*. An example conductive via 95 is shown extending vertically downward from conductive structure 16*b*, for example to connect to suitable circuitry (not shown) to provide desired common voltage(s) to bottom capacitor electrodes 28 as opposed to allowing their voltage to float or for programming capacitors 40 if capacitor insulator 38** is programmable. Any other attribute(s) or aspect(s) as shown and/or described herein with respect to other embodiments may be used.

Figure 40:
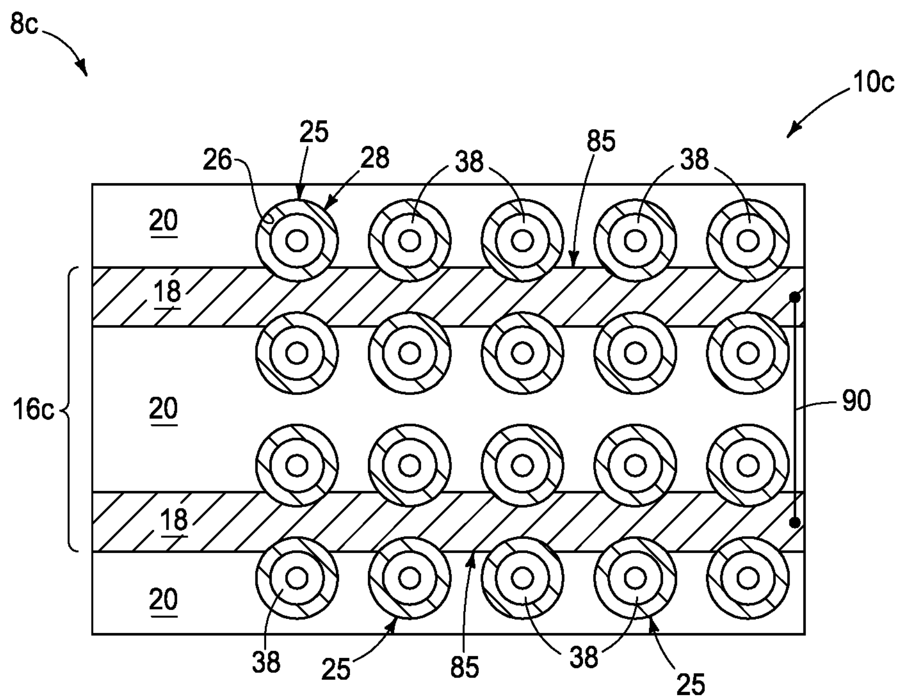
FIG. 40 is a diagrammatic cross-sectional view of a portion of a substrate in accordance with an embodiment of the invention.

The above example methods show examples where conductive structure 16 comprises a plate extending globally horizontally within an array area 10 in which capacitors 40 are received. FIG. 40, by way of example only, shows an alternate example embodiment construction **8*c* comprising an array 10*c* and that is taken horizontally through an alternate configuration conductive structure 16*c*. Like numerals from the above-described embodiments have been used where appropriate, with some construction differences being indicated with the suffix “c” or with different numerals. Conductive structure 16*c* comprises a plurality of horizontally-spaced conductive lines 85 that may be directly electrically coupled together, for example as shown schematically by an interconnect line 90**. Other existing or future-developed constructions and/or techniques may be used to directly electrically couple a plurality of bottom capacitor electrodes together. Any other attribute(s) or aspect(s) as shown and/or described herein with respect to other embodiments may be used.

Embodiments of the invention encompass an array of capacitors independent of method of manufacture and an array of memory cells independent of method of manufacture. Nevertheless, such array(s) may have any of the attributes as described herein in method embodiments. Likewise, the above-described method embodiments may incorporate and form any of the attributes described with respect to device embodiments.

Embodiments of the invention include an array (e.g., 10, **10*a*, 10*b*, 10*c*) of capacitors comprising a plurality of capacitors (e.g. 40) individually comprising a bottom capacitor electrode (e.g., 28), a top capacitor electrode (e.g. 36) laterally-inward of and above the bottom capacitor electrode, and a capacitor insulator (e.g., 38) between the top and bottom capacitor electrodes. A conductive structure (e.g., 16, 16*b*, 16*c*) directly electrically couples the bottom capacitor electrodes together. The conductive structure comprises conductive material (e.g., 18**) that is directly against the bottom capacitor electrodes and has an intrinsic electrical resistance of 0.001 to 1.0 ohm·cm. Any other attribute(s) or aspect(s) as shown and/or described herein with respect to other embodiments may be used.

Embodiments of the invention encompass an array (e.g., 10, **10*a*, 10*b*, 10*c*) of memory cells (e.g., 75) comprising a plurality of capacitors (e.g., 40) individually comprising a bottom capacitor electrode (e.g., 28), a top capacitor electrode (e.g., 36), laterally-inward of and above the bottom capacitor electrode, and a capacitor insulator (e.g., 38) between the top and bottom capacitor electrodes. A conductive structure (e.g., 16, 16*b*, 16*c*) directly electrically couples the bottom capacitor electrodes together. The conductive structure comprises conductive material (e.g., 18) that is directly against the bottom capacitor electrodes. In one embodiment, the conductive material of the conductive structure has intrinsic electrical resistance of 0.001 to 1.0 ohm-cm. A plurality of vertical transistors (e.g., 60) is above the plurality of capacitors. The vertical transistors individually comprise a top source/drain region (e.g., 52), a bottom source/drain region (e.g., 54), and a channel region (e.g., 56**) vertically there-between. Individual of the bottom source/drain regions are directly electrically coupled to individual of the top capacitor electrodes. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming an array of capacitors comprises forming a vertical stack above a substrate. The stack comprises a horizontally-elongated conductive structure and an insulator material directly above the conductive structure. Horizontally-spaced openings are formed in the insulator material to the conductive structure. An upwardly-open container-shaped bottom capacitor electrode is formed in individual of the openings. The bottom capacitor electrode is directly against conductive material of the conductive structure. The conductive structure directly electrically couples the bottom capacitor electrodes together. A capacitor insulator is formed in the openings laterally-inward of the bottom capacitor electrodes. A top capacitor electrode is formed in individual of the openings laterally-inward of the capacitor insulator. The top capacitor electrodes are not directly electrically coupled together.

In some embodiments, a method of forming an array of memory cells comprises forming a vertical stack above a substrate. The stack comprises a horizontally-elongated conductive structure and an insulator material directly above the conductive structure. A plurality of capacitors is formed and comprises forming horizontally-spaced openings in the insulator material to the conductive structure. An upwardly-open container-shaped bottom capacitor electrode is formed in individual of the openings. The bottom capacitor electrode is directly against conductive material of the conductive structure. The conductive structure directly electrically couples the bottom capacitor electrodes together. A capacitor insulator is formed in the openings laterally-inward of the bottom capacitor electrodes. A top capacitor electrode is formed in individual of the openings laterally-inward of the capacitor insulator. The top capacitor electrodes are not directly electrically coupled together. A plurality of vertical transistors is formed above the plurality of capacitors. The vertical transistors individually comprise transistor material comprising a top source/drain region, a bottom source/drain region, and a channel region vertically there-between. Individual of the bottom source/drain regions are directly electrically coupled to individual of the top capacitor electrodes.

In some embodiments, an array of capacitors comprises a plurality of capacitors individually comprising a bottom capacitor electrode, a top capacitor electrode laterally-inward of and above the bottom capacitor electrode, and a capacitor insulator between the top and bottom capacitor electrodes. A conductive structure directly electrically couples the bottom capacitor electrodes together. The conductive structure comprises conductive material that is directly against the bottom capacitor electrodes and has intrinsic electrical resistance of 0.001 to 1.0 ohm·cm.

In some embodiments, an array of memory cells comprises a plurality of capacitors individually comprising a bottom capacitor electrode, a top capacitor electrode laterally-inward of and above the bottom capacitor electrode, and a capacitor insulator between the top and bottom capacitor electrodes. A conductive structure directly electrically couples the bottom capacitor electrodes together. The conductive structure comprises conductive material that is directly against the bottom capacitor electrodes. A plurality of vertical transistors is above the plurality of capacitors. The vertical transistors individually comprise a top source/drain region, a bottom source/drain region, and a channel region vertically there-between. Individual of the bottom source/drain regions are directly electrically coupled to individual of the top capacitor electrodes.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of capacitors, comprising:

forming a vertical stack above a substrate, the stack comprising a horizontally-elongated conductive structure and an insulator material directly above the conductive structure;

forming horizontally-spaced openings in the insulator material to the conductive structure;

forming an upwardly-open container-shaped bottom capacitor electrode in individual of the openings, the bottom capacitor electrode being directly against conductive material of the conductive structure, the conductive structure directly electrically coupling the bottom capacitor electrodes together;

forming a capacitor insulator in the openings laterally-inward of the bottom capacitor electrodes; and forming a top capacitor electrode in individual of the openings laterally-inward of the capacitor insulator, the top capacitor electrodes not being directly electrically coupled together.

2. The method of claim 1 wherein the conductive material of the conductive structure has intrinsic electrical resistance of 0.001 to 1.0 ohm-cm.

3. The method of claim 1 wherein the conductive structure comprises a plate extending globally horizontally within an array area in which the capacitors are received.

4. The method of claim 1 wherein the conductive structure comprises a plurality of directly-electrically-coupled and horizontally-spaced conductive lines.

5. The method of claim 1 comprising forming the capacitor insulator directly above top surfaces of the bottom capacitor electrodes.

6. The method of claim 1 comprising forming the capacitor insulator directly against the top surfaces of the bottom capacitor electrodes.

7. The method of claim 1 laterally-thinning the capacitor insulator above top surfaces of the bottom capacitor electrodes before forming the top capacitor electrodes.

8. The method of claim 1 comprising forming individual of the bottom capacitor electrodes directly against at least one lateral side surface of the conductive material of the conductive structure.

9. The method of claim 8 comprising forming the individual bottom capacitor electrodes directly against multiple of the lateral side surfaces of the conductive material of the conductive structure.

10. The method of claim 1 comprising forming individual of the bottom capacitor electrodes directly against a top surface of the conductive material of the conductive structure.

11. The method of claim 1 wherein the bottom capacitor electrodes have top surfaces that are higher than top surfaces of the conductive material of portions of the conductive structure that are immediately-laterally-adjacent thereto.

12. The method of claim 11 wherein the top surfaces of the bottom capacitor electrodes are not horizontally-planar.

13. The method of claim 1 comprising forming the openings to extend vertically through the conductive material of the conductive structure.

14. The method of claim 13 comprising forming the openings to extend into insulating material below the conductive structure.

15. The method of claim 14 comprising forming the conductive structure to be closer to tops of the openings than to bottoms of the openings.

16. The method of claim 1 wherein the openings are not formed to extend vertically through the conductive material of the conductive structure.

17. The method of claim 16 wherein forming the openings comprises etching of the insulator material selectively relative to and to finally stop on the conductive material of the conductive structure.

18. The method of claim 1 comprising forming the conductive structure to be closer to tops of the bottom capacitor electrodes than to bottoms of the bottom capacitor electrodes.

19. The method of claim 1 comprising forming the conductive structure to be closer to bottoms of the bottom capacitor electrodes than to tops of the bottom capacitor electrodes.

20. A method of forming an array of memory cells, comprising:

forming a vertical stack above a substrate, the stack comprising a horizontally-elongated conductive structure and an insulator material directly above the conductive structure;

forming a plurality of capacitors, comprising:

forming horizontally-spaced openings in the insulator material to the conductive structure;

forming an upwardly-open container-shaped bottom capacitor electrode in individual of the openings, the bottom capacitor electrode being directly against conductive material of the conductive structure, the conductive structure directly electrically coupling the bottom capacitor electrodes together;

forming a capacitor insulator in the openings laterally-inward of the bottom capacitor electrodes; and forming a top capacitor electrode in individual of the openings laterally-inward of the capacitor insulator, the top capacitor electrodes not being directly electrically coupled together; and forming a plurality of vertical transistors above the plurality of capacitors; the vertical transistors individually comprising transistor material comprising a top source/drain region, a bottom source/drain region, and a channel region vertically there-between; individual of the bottom source/drain regions being directly electrically coupled to individual of the top capacitor electrodes.

21. The method of claim 20 comprising forming the memory cells to comprise DRAM.

22. The method of claim 20 wherein forming the plurality of vertical transistors comprises:

forming conductive gate lines that interconnect multiple of the vertical transistors in individual rows;

forming the top source/drain region, the bottom source/drain region, and the channel region to comprise a vertically-elongated pillar; and forming the conductive gate lines after completing formation of the pillars.

23. The method of claim 20 wherein forming the plurality of vertical transistors comprises:

forming conductive gate lines that interconnect multiple of the vertical transistors in individual rows;

forming the top source/drain region, the bottom source/drain region, and the channel region to comprise a vertically-elongated pillar; and forming the conductive gate lines before completing formation of the pillars.

24. The method of claim 23 wherein forming the pillars sequentially comprises:

etching through material of the top source/drain regions, the channel regions, and the bottom source/drain regions to form first walls and first trenches laterally there-between; the first walls and first trenches being horizontally-elongated in a first direction;

forming insulative material in the first trenches between the first walls;

etching into the first walls through material of the top source/drain regions, into material of the channel regions, and into the insulative material to form second walls and second trenches laterally there-between; the second walls and second trenches being horizontally-elongated in a second direction that is angled from the first direction;

forming the conductive gate lines in the second trenches operatively-adjacent the material of the channel regions; and etching through more of the transistor material.

* * * * *